(12) United States Patent
Kanto et al.

(10) Patent No.: US 10,573,681 B2
(45) Date of Patent: Feb. 25, 2020

(54) IMAGING DEVICE, CAMERA, AND IMAGING METHOD

(71) Applicant: PANASONIC INTELLECTUAL PROPERTY MANAGEMENT CO., LTD., Osaka (JP)

(72) Inventors: Hiroaki Kanto, Osaka (JP); Norikatsu Yoshida, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/422,291

(22) Filed: May 24, 2019

(65) Prior Publication Data
US 2019/0280037 A1 Sep. 12, 2019

Related U.S. Application Data

(63) Continuation of application No. PCT/JP2017/046599, filed on Dec. 26, 2017.

(30) Foreign Application Priority Data

Dec. 27, 2016 (JP) .................. 2016-254499

(51) Int. Cl.
*H01L 21/00* (2006.01)
*H01L 27/146* (2006.01)
(Continued)

(52) U.S. Cl.
CPC .. *H01L 27/14638* (2013.01); *H01L 27/11807* (2013.01); *H01L 27/142* (2013.01);
(Continued)

(58) Field of Classification Search
CPC ......... H01L 27/14638; H01L 27/11807; H01L 27/142; H01L 27/146; H04N 5/2254
See application file for complete search history.

(56) References Cited

U.S. PATENT DOCUMENTS 7,745,776 B2 * 6/2010 Wada ................ H04N 5/235
250/208.1
8,466,532 B2 * 6/2013 Watanabe ......... H01L 27/14603
257/435
(Continued)

FOREIGN PATENT DOCUMENTS

JP 2008-042180 A 2/2008
JP 4292751 B2 7/2009

OTHER PUBLICATIONS

International Search Report and Written Opinion, dated Mar. 13, 2018 in International Application No. PCT/JP2017/046599; with partial English translation.

*Primary Examiner* — Nicholas J Tobergte
(74) *Attorney, Agent, or Firm* — McDermott Will & Emery LLP

(57) ABSTRACT

An imaging device includes: an imaging element including a photoelectric conversion member that generates charge due to an internal photoelectric effect when receiving light at a voltage in a first predetermined range, and generates no charge due to the internal photoelectric effect when receiving light at a voltage in a second predetermined range, and a plurality of pixel circuits that accumulate, in each pixel, the charge generated by the photoelectric conversion member, the imaging element outputting a frame image based on an amount of charge accumulated in the plurality of pixel circuits; a voltage controller that controls a voltage to be applied to the photoelectric conversion member; and a corrector that performs correction on at least a part of one or more frame images output from the imaging element to reduce dark current signal components.

10 Claims, 30 Drawing Sheets

(51) Int. Cl.
*H01L 27/118* (2006.01)
*H01L 27/142* (2014.01)
*H04N 5/225* (2006.01)
*H04N 5/341* (2011.01)
*H04N 5/374* (2011.01)
*H04N 5/361* (2011.01)

(52) U.S. Cl.
CPC ........... *H04N 5/2254* (2013.01); *H04N 5/341* (2013.01); *H04N 5/361* (2013.01); *H04N 5/374* (2013.01); *H01L 27/146* (2013.01)

(56) References Cited

U.S. PATENT DOCUMENTS

| | | | |
|---|---|---|---|
| 9,313,427 B2* | 4/2016 | Moore | H04N 5/335 |
| 9,881,967 B2* | 1/2018 | Sato | H01L 27/14665 |
| 10,014,334 B2* | 7/2018 | Ikeda | H01L 27/14616 |
| 2007/0041063 A1 | 2/2007 | Kitada et al. | |

* cited by examiner

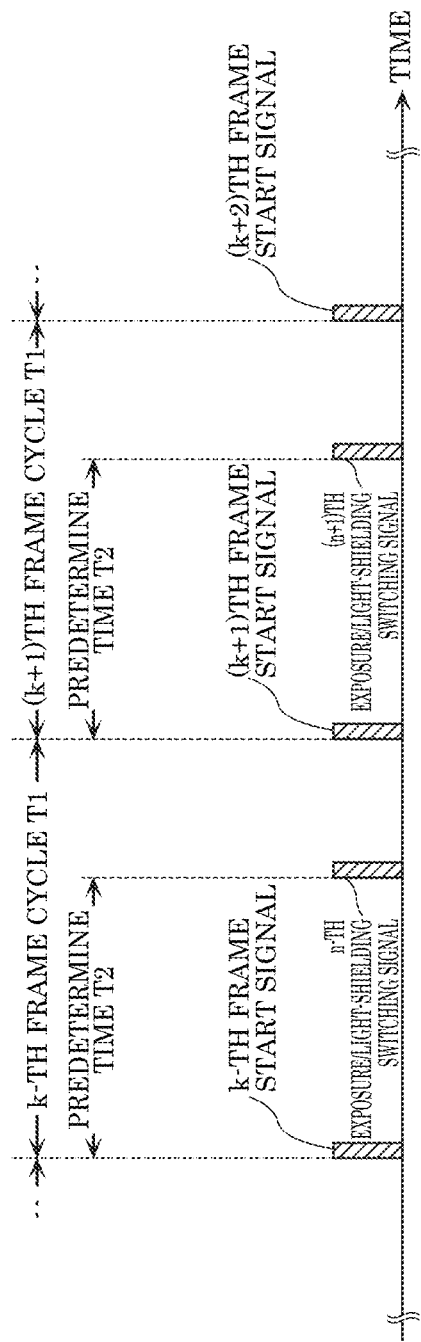

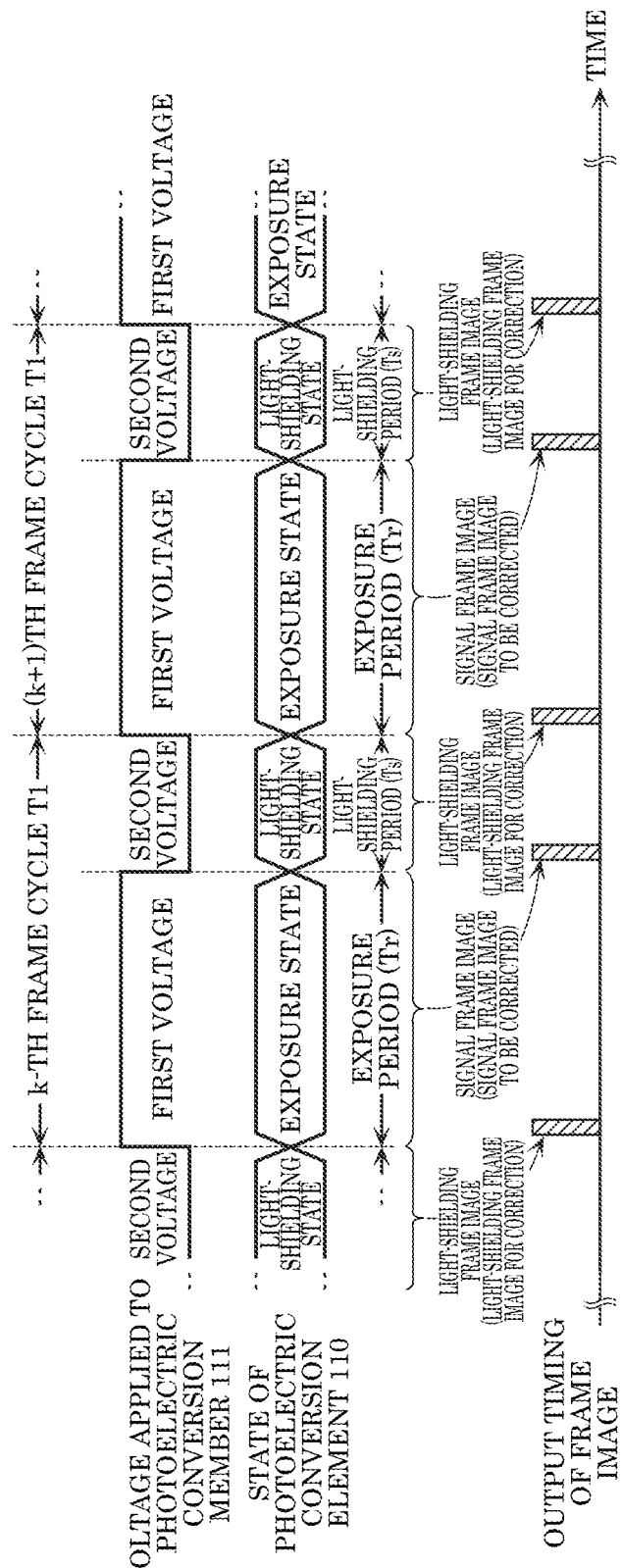

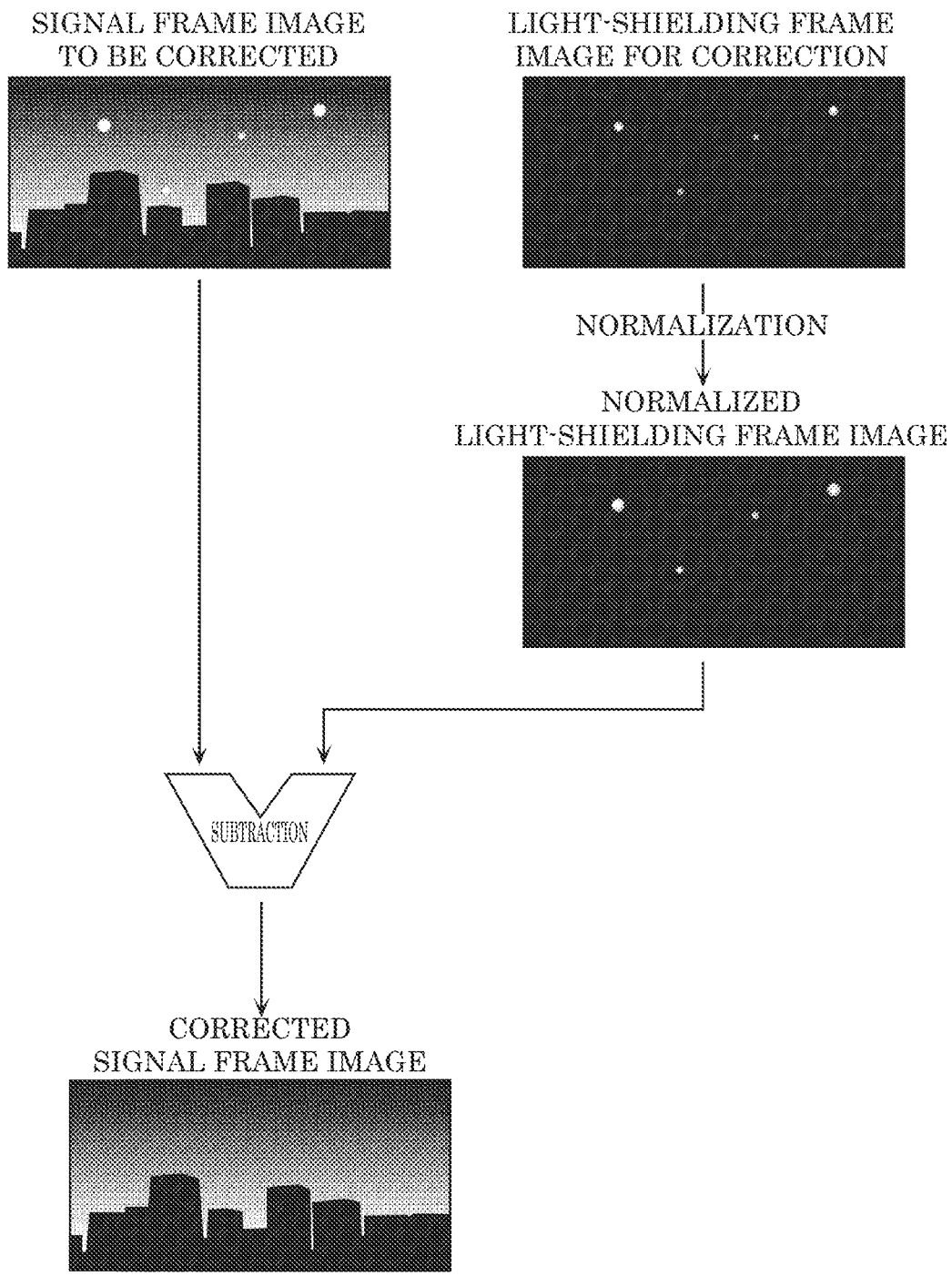

IMAGING DEVICE, CAMERA, AND IMAGING METHOD

CROSS REFERENCE TO RELATED APPLICATIONS

This is a continuation application of PCT International Application No. PCT/JP2017/046599 filed on Dec. 26, 2017, designating the United States of America, which is based on and claims priority of Japanese Patent Application No. 2016-254499 filed on Dec. 27, 2016. The entire disclosures of the above-identified applications, including the specifications, drawings and claims are incorporated herein by reference in their entirety.

BACKGROUND

1. Technical Field

The present disclosure relates to an imaging device, a camera, and an imaging method for capturing an image.

2. Description of the Related Art

An imaging device that captures a video image including a plurality of successive frame images by using an imaging element has heretofore been known.

In an imaging device of this type, a technique for reducing dark current signal components included in frame images is proposed.

For example, Japanese Patent No. 4292751 describes an imaging device in which a lens diaphragm is narrowed to obtain a light-shielding state, dark current signal components obtained in the light-shielding state are acquired and stored, and correction is performed to reduce the dark current signal components included in captured frame images by using the stored dark current signal components.

SUMMARY

To capture successive frames in the imaging device of the related art described above, it is necessary to bring the lens diaphragm into an opened state during the image capturing period. On the other hand, to acquire dark current signal components in the light-shielding state in this imaging device, it is necessary to narrow the lens diaphragm for a certain period to obtain the light-shielding state. Specifically, in this imaging device, the dark current signal components in the light-shielding state cannot be acquired during an image capturing period of capturing successive frame images.

Accordingly, this imaging device cannot perform the correction so as to reduce the dark current signal components included in frame images captured during the image capturing period of capturing successive frame images based on the dark current signal components in the light-shielding state acquired during the image capturing period.

Accordingly, the present disclosure is directed to providing an imaging device, a camera, and an imaging method which are capable of performing correction so as to reduce dark current signal components included in frame images captured during an image capturing period of capturing successive frame images based on dark current signal components in a light-shielding state acquired during the image capturing period.

In accordance with an aspect of the present disclosure, there is provided an imaging device including: an imaging element including: a photoelectric conversion member that generates charge due to an internal photoelectric effect when receiving light in a state where a voltage in a first predetermined range is applied, and generates no charge due to the internal photoelectric effect when receiving light in a state where a voltage in a second predetermined range is applied; and a plurality of pixel circuits that accumulate, in each pixel, the charge generated by the photoelectric conversion member, the imaging element outputting a frame image based on an amount of charge accumulated in the plurality of pixel circuits; a voltage controller that controls a voltage to be applied to the photoelectric conversion member; and a corrector that performs correction on at least a part of one or more frame images output from the imaging element to reduce dark current signal components, wherein the voltage controller performs the control in such a manner that, during an exposure period included in a predetermined frame cycle, the voltage in the first predetermined range is applied to the photoelectric conversion member, and during a light-shielding period other than the exposure period in the predetermined frame cycle, the voltage in the second predetermined range is applied to the photoelectric conversion member, the imaging element outputs, every frame cycle, a signal frame image based on an amount of charge accumulated in the plurality of pixel circuits during the exposure period, and a light-shielding frame image based on an amount of charge accumulated in the plurality of pixel circuits during the light-shielding period, and the corrector performs the correction on the signal frame image output from the imaging element by using the light-shielding frame image output from the imaging element.

In accordance with another aspect of the present disclosure, a camera includes: the above-described imaging device; and a lens that focuses external light on the imaging element.

In accordance with still another aspect of the present disclosure, there is provided an imaging method to be performed by an imaging device including an imaging element, a voltage controller, and a corrector. The imaging element includes: a photoelectric conversion member that generates charge due to an internal photoelectric effect when receiving light in a state where a voltage in a first predetermined range is applied, and generates no charge due to the internal photoelectric effect when receiving light in a state where a voltage in a second predetermined range is applied; and a plurality of pixel circuits that accumulate, in each pixel, the charge generated by the photoelectric conversion member. The imaging method includes: outputting, by the imaging element, a frame image based on an amount of charge accumulated in the plurality of pixel circuits; controlling, by the voltage controller, a voltage to be applied to the photoelectric conversion member; and performing, by the corrector, correction on at least a part of one or more frame images output from the imaging element to reduce dark current signal components, wherein in the controlling, the controlling is performed by the voltage controller in such a manner that, during an exposure period included in a predetermined frame cycle, the voltage in the first predetermined range is applied to the photoelectric conversion member, and during a light-shielding period other than the exposure period in the predetermined frame cycle, the voltage in the second predetermined range is applied to the photoelectric conversion member, in the outputting of the frame image, the imaging element outputs, every frame cycle, a signal frame image based on an amount of charge accumulated in the plurality of pixel circuits during the exposure period, and a light-shielding frame image based on an amount of charge accumulated in the plurality of pixel circuits during the light-shielding period, and in the performing of the correction, the correction is performed by the corrector on the signal frame image output from the imaging element by using the light-shielding frame image output from the imaging element.

An imaging device, a camera, and an imaging method according to the present disclosure described above are capable of performing correction so as to reduce dark current signal components included in frame images captured during an image capturing period of capturing successive frame images based on dark current signal components in a light-shielding state acquired during the image capturing period.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 5A is a timing diagram illustrating an operation of a voltage controller.

FIG. 5B is a timing diagram illustrating an operation of the imaging element.

FIG. 6 is a schematic view illustrating a state where a corrector performs correction.

DETAILED DESCRIPTION OF THE EMBODIMENTS

Hereinafter, a certain exemplary embodiment is described in greater detail. It should be noted that the embodiment described below is a specific example of the present disclosure. Numerical values, shapes, materials, constituent elements, arrangement positions and the connection configuration of the constituent elements, steps, the order of the steps, and the like described in the following embodiment are merely examples, and are not intended to limit the present disclosure. The present disclosure is characterized by the appended claims. Therefore, among the constituent elements in the following embodiment, constituent elements that are not described in independent claims are described as elements constituting more desirable configurations, although such constituent elements are not necessarily required to achieve the object of the present disclosure.

Embodiment

Imaging device 1 that captures an image will now be described with reference to the accompanying drawings.
[1-1. Configuration]

Figure 1:
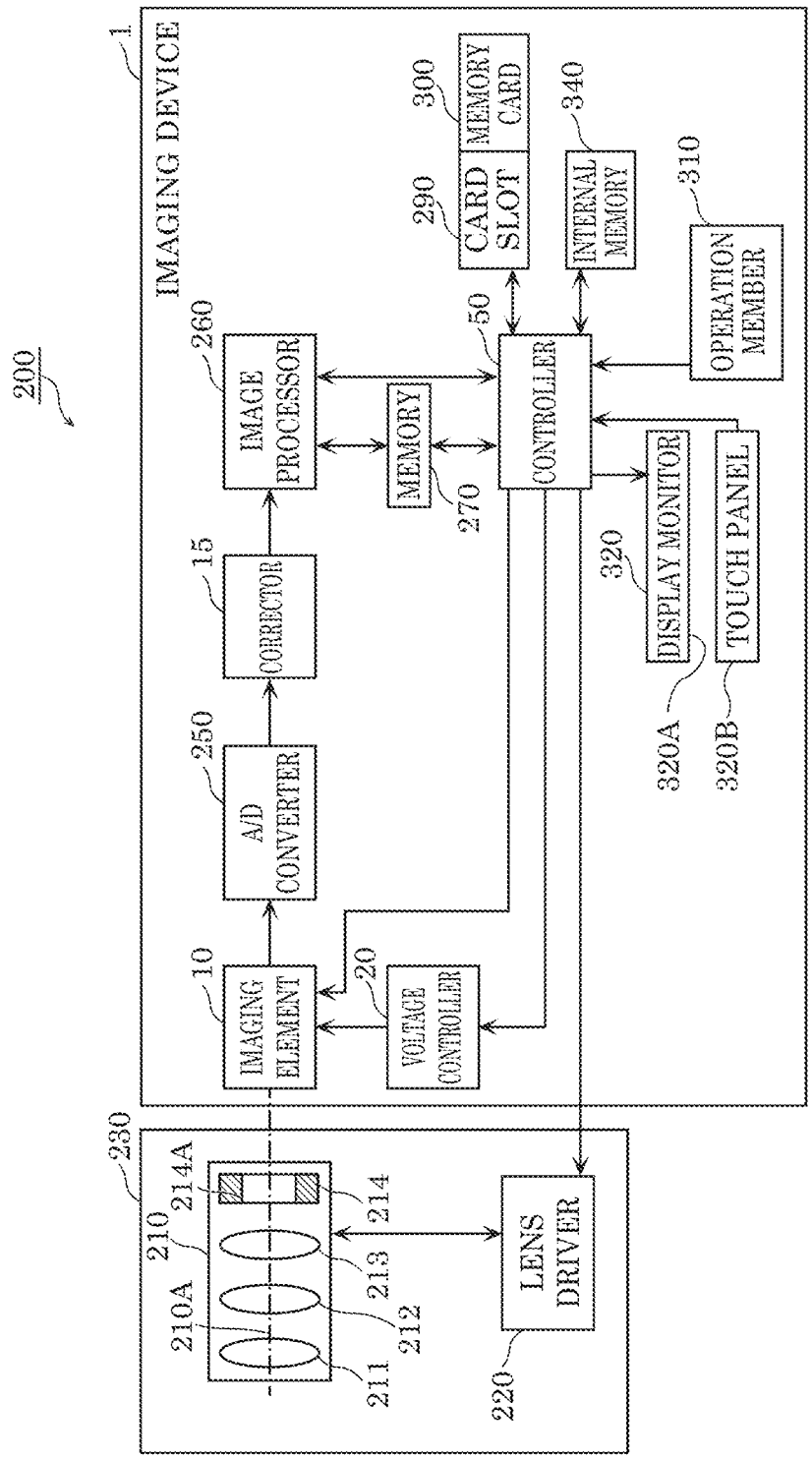
FIG. 1 is a block diagram illustrating a configuration of a camera according to an embodiment.

FIG. 1 is a block diagram illustrating a configuration of camera 200 according to an embodiment.

Camera 200 includes lens barrel 230 and imaging device 1. Further, lens barrel 230 includes optical system 210 and lens driver 220.

Optical system 210 includes one or more lenses that focus external light on imaging element 10 of imaging device 1. Specifically, optical system 210 includes zoom lens 211, hand shake correction lens 212, focus lens 213, and diaphragm 214. Zoom lens 211 is caused to move along optical axis 210A, thereby enabling an object image to be enlarged or reduced. Further, focus lens 213 is caused to move along optical axis 210A, thereby enabling focusing of the object image to be adjusted. Furthermore, hand shake correction lens 212 is movable within a plane perpendicular to optical axis 210A of optical system 210. Hand shake correction lens 212 is moved in a direction in which shaking of camera 200 is cancelled out, thereby making it possible to reduce the effect of shaking of camera 200 on captured images. In addition, diaphragm 214 includes aperture section 214A located on optical axis 210A. The size of aperture section 214A is adjusted automatically or according to a user's setting, to thereby adjust the amount of light to be transmitted.

Lens driver 220 includes a zoom actuator that drives zoom lens 211, a hand shake correction actuator that drives hand shake correction lens 212, a focus actuator that drives focus lens 213, and a diaphragm actuator that drives diaphragm 214. Further, lens driver 220 controls the above-described zoom actuator, focus actuator, hand shake correction actuator, and diaphragm actuator.

Imaging device 1 includes imaging element 10, corrector 15, voltage controller 20, controller 50, A/D converter 250, image processor 260, memory 270, card slot 290, internal memory 340, operation member 310, and display monitor 320.

Imaging element 10 outputs a signal frame image (to be described below) and a light-shielding frame image (to be described below) at predetermined frame cycle T1 (for example, 1/60 seconds).

A/D converter 250 performs analog gain-up on analog image data generated by imaging element 10, and converts the analog image data into digital image data as a digital signal.

Corrector 15 performs correction on at least a part of one or more frame images (digital image data obtained through the conversion by A/D converter 250 in this case) output from imaging element 10 so as to reduce dark current signal components. Corrector 15 is implemented in such a manner that, for example, a processor (not illustrated) executes a program stored in a memory (not illustrated).

Voltage controller 20 controls a voltage to be applied to photoelectric conversion member 111 (to be described below) included in imaging element 10. Voltage controller 20 is implemented in such a manner that, for example, a processor (not illustrated) executes a program stored in a memory (not illustrated).

Image processor 260 performs various processing on the image data (frame image corrected by corrector 15 in this case) generated by imaging element 10, generates image data to be displayed on display monitor 320, and generates image data to be stored in memory card 300. For example, image processor 260 performs various processing, such as gamma correction and white balance correction, on the image data generated by imaging element 10. Further, image processor 260 compresses the image data generated by imaging element 10 in accordance with a compression format or the like based on 11.264 standards or MPEG2 standards. Image processor 260 can be implemented in such a manner that, for example, a processor (not illustrated) executes a program stored in a memory (not illustrated).

Controller 50 controls the entirety of camera 200. Controller 50 is implemented in such a manner that, for example, a processor (not illustrated) in controller 50 loads a program recorded on internal memory 340 into memory 270 that temporarily stores data, and executes the loaded program.

Memory 270 also functions as a work memory for image processor 360 and controller 50. Memory 270 is implemented using, for example, a DRAM or SRAM.

Card slot 390 detachably holds memory card 300. Card slot 290 can be mechanically or electrically connected to memory card 300. Memory card 300 includes a nonvolatile flash memory or a ferroelectric memory therein, and can store data, such as an image file, which is generated by image processor 260.

Internal memory 340 includes a nonvolatile flash memory and a ferroelectric memory. Internal memory 340 stores a control program and the like for controlling the entirety of camera 200.

Operation member 310 is a generic term used to refer to user interfaces that receive an operation from a user. Operation member 310 includes, for example, a directional pad and a decision button, which receive an operation from a user.

Display monitor 320 includes screen 320A capable of displaying images indicated by the image data generated by imaging element 10, and images indicated by the image data read out from memory card 300. Further, display monitor 320 can also display various menu screens for performing various settings for camera 200 on screen 320A. Touch panel 320B is arranged on screen 320A of display monitor 320. Touch panel 320B can receive various touch operations when the user touches touch panel 320B. An instruction indicated by a touch operation on touch panel 320B is sent to controller 50 and various processing are carried out.

Imaging element 10, corrector 15, and voltage controller 20 among the components constituting imaging device 1 will be described in more detail below with reference to the accompanying drawings.

Figure 2:
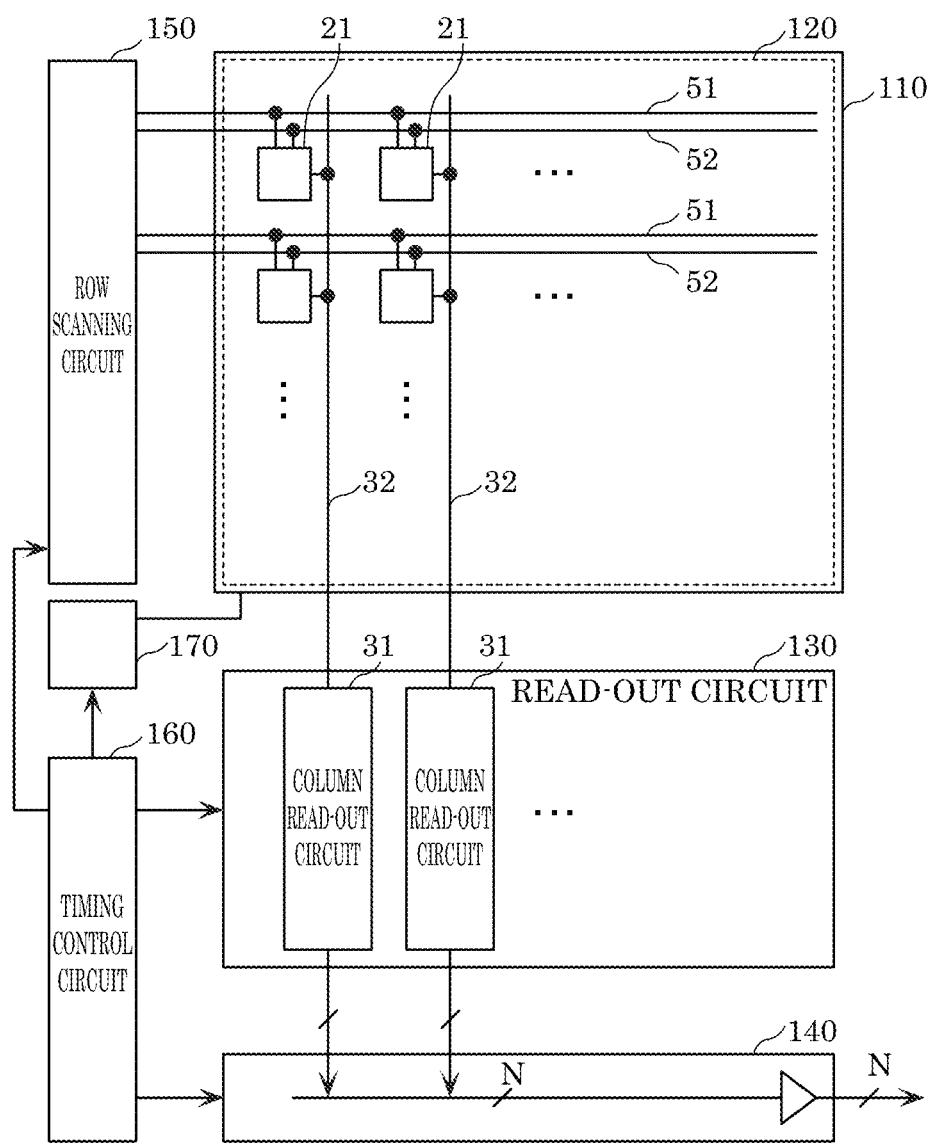
FIG. 2 is a block diagram illustrating a configuration of an imaging element.

FIG. 2 is a block diagram illustrating the configuration of imaging element 10.

As illustrated in the figure, imaging element 10 includes photoelectric conversion element 110, pixel circuit array 120, read-out circuit 130, output circuit 140, row scanning circuit 150, timing control circuit 160, and voltage application circuit 170.

Figure 3A:
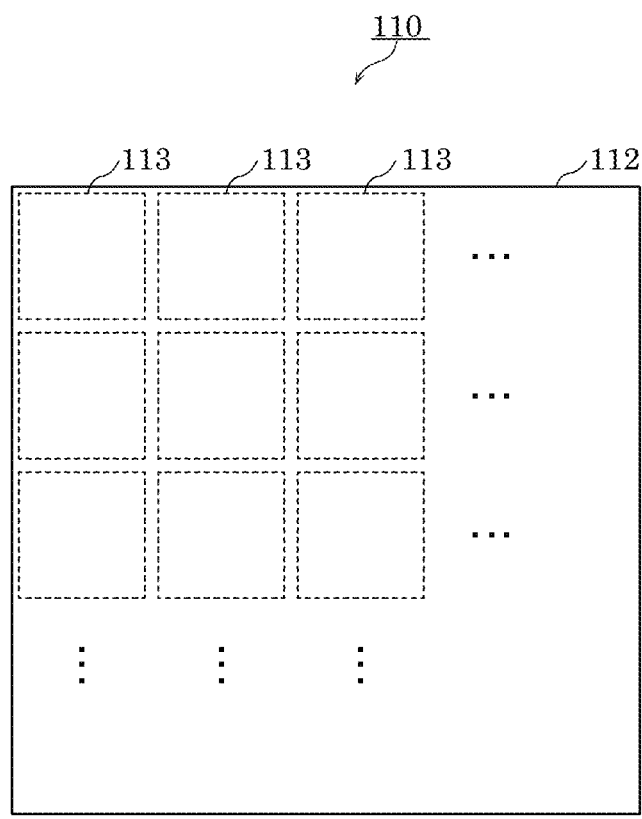
FIG. 3A is a plan view illustrating a photoelectric conversion element.
Figure 3B:
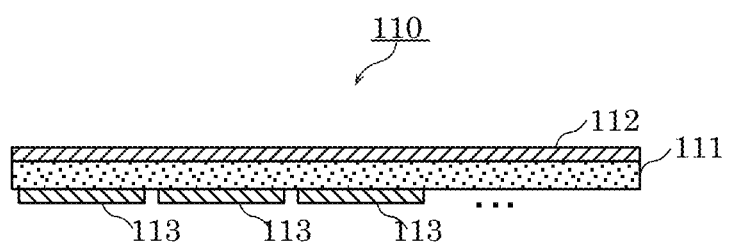
FIG. 3B is a side view illustrating the photoelectric conversion element.

FIG. 3A is a plan view illustrating photoelectric conversion element 110, and FIG. 3B illustrates a side view of photoelectric conversion element 110.

As illustrated in FIGS. 3A and 3B, photoelectric conversion element 110 includes thin-film-like photoelectric conversion member 111, upper transparent electrode 112 that is in close contact with an upper surface of photoelectric conversion member 111, and N×M lower pixel electrodes 113 (N and M are integers equal to or greater than 1) which are arranged in a two-dimensional array of N rows and M columns and are in close contact with a lower surface of photoelectric conversion member 111.

Photoelectric conversion member 111 generates charge due to an internal photoelectric effect by receiving light in a state where a voltage in a first predetermined range, excluding 0 V, is applied, and does not generate any charge due to the internal photoelectric effect when light is received in a state where a voltage in a second predetermined range, including 0 V, is applied.

A description is made assuming that photoelectric conversion member 111 is an organic thin film having the characteristics described above. Specifically, this embodiment illustrates an example in which imaging element 10 is an organic complementary metal-oxide-semiconductor (CMOS) image sensor using an organic thin film as a photoelectric conversion member.

Upper transparent electrode 112 is a transparent electrode that applies a voltage, which causes a potential difference including 0 on the lower surface, to the entire upper surface of photoelectric conversion member 111.

Lower pixel electrodes 113 are electrodes arranged in a two-dimensional array of N rows and M columns so as to cover the entire lower surface of photoelectric conversion member 111.

In a case where a voltage, which causes a positive potential difference on the lower surface, is applied to the upper surface of photoelectric conversion member 111, lower pixel electrodes 113 collect positive charge in the charge generated in the vicinity of each of lower pixel electrodes 113 when photoelectric conversion member 111 generates charge.

In photoelectric conversion element 110 having the configuration described above, each of lower pixel electrodes 113 collects positive charge generated due to the internal photoelectric effect of light reception under a condition that a voltage that causes a positive potential difference in a range in which the internal photoelectric effect is generated on the lower surface is applied to the upper surface of photoelectric conversion member 111. Specifically, photoelectric conversion element 110 is in an exposure state under this condition. On the other hand, under a condition that the potential of the upper surface of photoelectric conversion member 111 is substantially the same as the potential of the lower surface, the charge due to the internal photoelectric effect are not generated even when light is received. Accordingly, each of lower pixel electrodes 113 does not collect charge. In other words, photoelectric conversion element 110 is in a light-shielding state under this condition.

A period in which the voltage that causes the positive potential difference in the range in which the internal photoelectric effect is generated on the lower surface is applied to the upper surface of photoelectric conversion member 111 is hereinafter referred to as an exposure period. A period in which a voltage (a voltage having substantially the same potential as that of the lower surface in this case) in a range in which the internal photoelectric effect is not generated on the lower surface is applied to the upper surface of photoelectric conversion member 111 is hereinafter referred to as a light-shielding period.

Referring again to FIG. 2, the description of imaging element 10 is continued.

Pixel circuit array 120 is a semiconductor device having a configuration in which N×M pixel circuits 21 are arranged in a two-dimensional array of N rows and M columns, and are arranged so as to overlap photoelectric conversion element 110 on the lower surface side of photoelectric conversion element 110.

In pixel circuit array 120, pixel circuits 21 are arranged in such a manner that the positions of pixel circuits 21 overlap the positions of lower pixel electrodes 113, respectively, on one-to-one correspondence in a plan view of imaging element 10.

Figure 4:
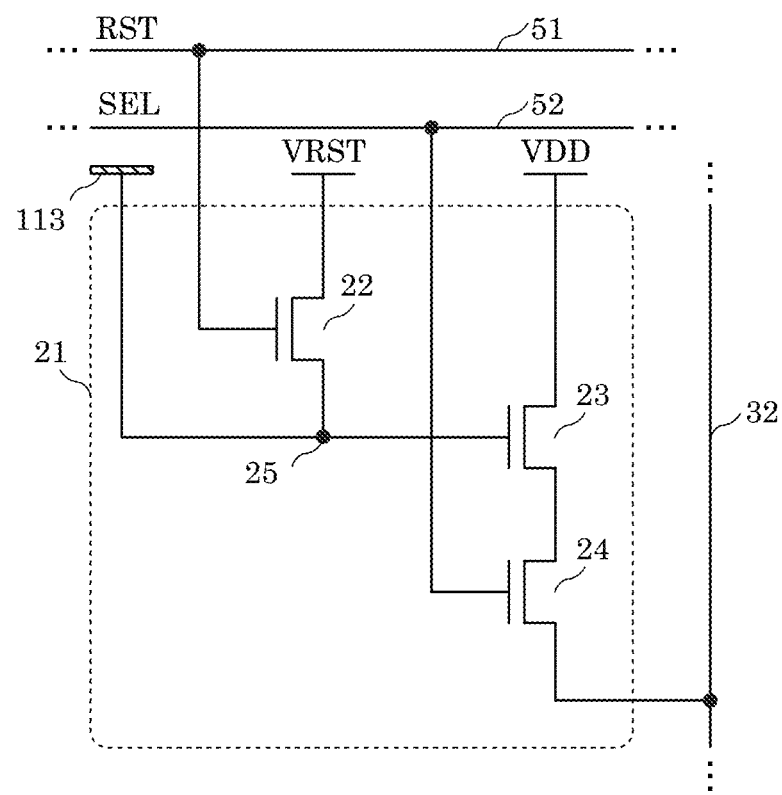
FIG. 4 is a block diagram illustrating a configuration of a pixel circuit.

FIG. 4 is a block diagram illustrating a configuration of each pixel circuit 21.

As illustrated in the figure, pixel circuit 21 includes reset transistor 22, amplification transistor 23, selection transistor 24, and charge accumulation node 25.

Charge accumulation node 25 is connected to each of lower pixel electrodes 113 corresponding to pixel circuit 21 to which charge accumulation node 25 belongs, the source of reset transistor 22, and the gate of amplification transistor 23, and accumulates positive charge collected by connected lower pixel electrode 113.

The gate of reset transistor 22 is connected to reset signal line 51. The drain of reset transistor 22 is supplied with reset voltage VRST. The source of reset transistor 22 is connected to charge accumulation node 25.

Reset transistor 22 resets (initializes) the amount of charge accumulated in charge accumulation node 25 when reset transistor 22 is turned on by a reset signal sent from row scanning circuit 150 (to be described below) through reset signal line 51.

The gate of amplification transistor 23 is connected to charge accumulation node 25. The drain of amplification transistor 23 is supplied with power supply voltage VDD. The source of amplification transistor 23 is connected to the drain of selection transistor 24.

A voltage that depends on the charge accumulated in charge accumulation node 25 is applied to the gate of amplification transistor 23.

Accordingly, amplification transistor 23 functions as a current source that causes a current to flow depending on the charge accumulated in charge accumulation node 25 when selection transistor 24 is an ON state.

The gate of selection transistor 24 is connected to selection signal line 52. The drain of selection transistor 24 is connected to the source of amplification transistor 23. The source of selection transistor 24 is connected to vertical signal line 32.

Selection transistor 24 outputs a current flowing through amplification transistor 23 to vertical signal line 32 when selection transistor 24 is turned on by a selection signal sent from row scanning circuit 150 (to be described below) through selection signal line 52.

As described below, when the amount of current to be output to vertical signal line 32 is detected by column read-out circuits 31 (to be described below), the amount of charge accumulated in charge accumulation node 25 of pixel circuits 21 including selection transistor 24 turned on by the selection signal is read out.

With the configuration described above, each of pixel circuits 21 accumulates, in each pixel, charge generated by photoelectric conversion member 111 in charge accumulation node 25. Then, the amount of charge accumulated in charge accumulation node 25 is read out in a nondestructive manner.

Referring again to FIG. 2, the description of imaging element 10 is continued.

Row scanning circuit 150 includes an accumulated charge amount reset function to be described below and a read-out pixel circuit selection function to be described below.

The accumulated charge amount reset function is a function that, in pixel circuit array 120, reset signals for resetting the positive charge accumulated in charge accumulation node 25 in each pixel circuit 21 belonging to the corresponding row are sequentially sent through reset signal lines 51, each of which is connected to pixel circuit 21 belonging to the corresponding row, from a row (first row) that is farthest from read-out circuit 130 to a row (N-th row) that is closest to read-out circuit 130 on a row-by-row basis.

Thus, resetting of the charge accumulated in charge accumulation nodes 25 of all pixel circuits 21 included in pixel circuit array 120 is sequentially executed from the first row to the N-th row on a row-by-row basis.

The read-out pixel circuit selection function is a function that, in pixel circuit array 120, selection signals for turning on selection transistor 24 in each pixel circuit 21 to belonging to the corresponding row are sequentially sent on a row-by-row basis from the first row to the N-th row through selection signal line 52 connected to each pixel circuit 21 belonging to the corresponding row.

Thus, the amount of charge accumulated in charge accumulation nodes 25 of all pixel circuits 21 included in pixel circuit array 120 is sequentially read out from the first row to the N-th row on a row-by-row basis.

Read-out circuit 130 reads out the amount of charge accumulated in each pixel circuit 21 constituting pixel circuit array 120.

Read-out circuit 130 includes M column read-out circuits 31 corresponding to M columns, respectively, in pixel circuit array 120.

Each of column read-out circuits 31 detects the amount of current flowing through amplification transistor 23 of each pixel circuit 21 (this pixel circuit 21 is also referred to as "read-out target pixel circuit 21") including selection transistor 24 that is turned on by the selection signal through vertical signal line 32 connected to each pixel circuit 21 belonging to the corresponding column, thereby reading out the amount of charge accumulated in charge accumulation node 25 of read-out target pixel circuit 21 and outputting a K-bit (K is a positive integer such as "8") digital signal representing the read-out amount of charge as a pixel value of read-out target pixel circuit 21.

Output circuit 140 outputs the frame image composed of the pixel value output from each column read-out circuit 31 to the outside.

The frame image output from output circuit 140 includes a signal frame image based on the amount of charge accumulated in charge accumulation node 25 of each pixel circuit 21 during a period in which photoelectric conversion element 110 is in the exposure state, and a light-shielding frame image based on the amount of charge accumulated in charge accumulation node 25 of each pixel circuit 21 during a period in which photoelectric conversion element 110 is in the light-shielding state.

During the period in which photoelectric conversion element 110 is in the light-shielding state, the charge accumulated in charge accumulation node 25 of each pixel circuit 21 is a dark current component of each pixel circuit 21. Accordingly, the light-shielding frame image is a frame image composed of a dark current component of each pixel circuit 21.

Voltage application circuit 170 applies a voltage to photoelectric conversion member 111. More specifically, voltage application circuit 170 controls the voltage to be applied to upper transparent electrode 112 and processes the upper surface of photoelectric conversion member 111 by (1) applying a first voltage in a first predetermined range, which causes a positive potential difference with which the internal photoelectric effect is generated, to the lower surface to bring photoelectric conversion element 110 into the exposure period during the period in which the first voltage is applied, and by (2) applying a second voltage in a second predetermined range, which causes a potential difference (the same potential as that of the lower surface in this case) that does not cause the positive potential difference with which the internal photoelectric effect is generated, to the lower surface to bring photoelectric conversion element 110 into the light-shielding period during the period in which the second voltage is applied.

Timing control circuit 160 controls an operation timing of row scanning circuit 150, an operation timing of read-out circuit 130, an operation timing of voltage application circuit 170, and an operation timing of output circuit 140. Specifically, timing control circuit 160 controls a timing for row scanning circuit 150 to execute the accumulated charge amount reset function and a timing for row scanning circuit 150 to execute the read-out pixel circuit selection function, controls a timing for read-out circuit 130 to read out the amount of charge accumulated in charge accumulation node 25 of pixel circuit 21 selected by the selection signal, controls a timing for voltage application circuit 170 to bring photoelectric conversion element 110 into the exposure period and a timing for voltage application circuit 170 to bring photoelectric conversion element 110 into the light-shielding period, and controls a timing for output circuit 140 to output frame images.

More specifically, upon receiving a frame start signal (to be described below) from voltage controller 20, timing control circuit 160 controls operation timings of row scanning circuit 150, read-out circuit 130, voltage application circuit 170, and output circuit 140, to (1) read out the amount of charge accumulated in charge accumulation nodes 25 of all pixel circuits 21 included in pixel circuit array 120, (2) output the frame image based on the read-out amount of charge to the outside as a light-shielding frame image, (3) reset the amount of charge accumulated in charge accumulation nodes 25 of all pixel circuits 21 included in pixel circuit array 120, and (4) start the application of the first voltage to photoelectric conversion member 111.

Further, upon receiving an exposure light-shielding switching signal (to be described below) from voltage controller 20, timing control circuit 160 controls operation timings of row scanning circuit 150, read-out circuit 130, voltage application circuit 170, and output circuit 140, to (1) read out the amount of charge accumulated in charge accumulation nodes 25 of all pixel circuits 21 included in pixel circuit array 120, (2) output the frame image based on the read-out amount of charge to the outside as a signal frame image, (3) reset the amount of charge accumulated in charge accumulation nodes 25 of all pixel circuits 21 included in pixel circuit array 120, and (4) start the application of the second voltage to photoelectric conversion member 111.

Referring again to FIG. 1, the description of imaging device 1 is continued.

Voltage controller 20 controls the voltage to be applied to photoelectric conversion member 111 in such a manner that the first voltage in the first predetermined range is applied to photoelectric conversion member 111 during the exposure period in a part of frame cycle T1 every predetermined frame cycle T1, and the second voltage in the second predetermined range is applied to photoelectric conversion member 111 during the light-shielding period, excluding the above-described exposure period, in frame cycle T1. More specifically, the voltage to be applied to photoelectric conversion member 111 is controlled by outputting the frame start signal indicating a start of a new frame cycle in frame cycle T1 to imaging element 10, and by outputting the exposure light-shielding switching signal indicating that the voltage to be applied to photoelectric conversion member 111 is switched from the first voltage to the second voltage in frame cycle T1 in which the phase is delayed by predetermined period T2 from the output of the frame start signal.

FIG. 5A is a timing diagram illustrating the frame start signal and the exposure light-shielding switching signal output from voltage controller 20. FIG. 5B is a timing diagram illustrating an operation of imaging element 10 when the frame start signal and the exposure light-shielding switching signal are received from voltage controller 20.

As illustrated in FIG. 5A, voltage controller 20 outputs the frame start signal and the exposure light-shielding switching signal to imaging element 10 every frame cycle T1 at a timing when the exposure light-shielding switching signal is delayed by predetermined period T2 (T2<T1) from the frame start signal.

As illustrated in FIG. 5B, upon receiving the frame start signal and the exposure light-shielding switching signal, which are output every frame cycle T1, from voltage controller 20, imaging element 10 applies the first voltage to photoelectric conversion member 111 during a period from a time when the frame start signal is received to a time when the subsequent exposure light-shielding switching signal is received, and applies the second voltage to photoelectric conversion member 111 during a period from a time when the exposure light-shielding switching signal is received to a time when the subsequent frame start signal is received.

Accordingly, photoelectric conversion element 110 is in the exposure state during the period from the time when the frame start signal is received to the time when the subsequent exposure light-shielding switching signal is received, and photoelectric conversion element 110 is in the light-shielding state during the period from the time when the exposure light-shielding switching signal is received to the time when the subsequent frame start signal is received.

Then, during the exposure period in which photoelectric conversion element 110 is in the exposure state, imaging element 10 reads out the amount of charge accumulated in charge accumulation node 25 of each pixel circuit 21 and outputs the signal frame image based on the read-out amount of charge, and during the light-shielding period in which photoelectric conversion element 110 is in the light-shielding state, imaging element 10 reads out the amount of charge accumulated in charge accumulation node 25 of each pixel circuit 21 and outputs the light-shielding frame image based on the read-out amount of charge.

Referring again to FIG. 1, the description of imaging device 1 is continued.

Corrector 15 performs correction on the signal frame image output from imaging element 10 so as to reduce the dark current signal components by using the light-shielding frame image output from imaging element 10.

In this case, corrector 15 corrects the signal frame image to be corrected (hereinafter referred to as "correction target signal frame image") using the light-shielding frame image output in the same frame cycle as the frame cycle in which the correction target signal frame image is output (hereinafter referred to as "correction light-shielding frame image").

FIG. 6 is a schematic view illustrating a state where corrector 15 performs correction.

In FIG. 6, white dots included in the correction target signal frame image and the light-shielding frame image for correction schematically represent dark current signal components in the corresponding pixel. For example, a dark current signal component called a "white flaw" may appear as a white dot on a frame image.

In general, the correction target signal frame image is an image in which dark current signal components are superimposed on an object image, and the light-shielding frame image for correction is an image is composed of dark current signal components.

First, corrector 15 performs normalization processing on the light-shielding frame image for correction to generate a normalized light-shielding frame image. The normalization processing described herein refers to processing for normalizing the light-shielding-state period (light-shielding period Ts) in the light-shielding frame image for correction by the exposure-state period (exposure period Tr) in the correction target signal frame image. More specifically, corrector 15 multiplies each pixel value of the light-shielding frame image for correction by the value of (exposure period Tr/light-shielding period Ts), thereby generating the normalized light-shielding frame image. Thus, the dark current signal components in the normalized light-shielding frame image are a (Tr/Ts)-fold of the dark current signal components in the light-shielding frame image for correction. Embodiment 1 illustrates an example in which Tr>Ts holds as illustrated in FIG. 5B. Accordingly, as illustrated in FIG. 6, the brightness of so-called "white flaw" in the normalized light-shielding frame image is greater than the brightness of so-called "white flaw" in the light-shielding frame image for correction.

Then, corrector 15 subtracts the pixel value of each pixel in the normalized light-shielding frame image from the corresponding pixel value of each pixel in the correction target signal frame image, thereby generating a corrected signal frame image.

Corrector 15 performs the above-described processing to generate the corrected signal frame image in which dark current signal components are reduced from the correction target signal frame image.

An operation to be performed by imaging device 1 having the configuration described above will be described below with reference to the accompanying drawings.

[1-2. Operation]

Imaging device 1 performs first frame image output processing and first correction processing as its characteristic operations.

These processing steps will be sequentially described below.

[1-2-1. First Frame Image Output Processing]

The first frame image output processing is processing in which imaging element 10 outputs the signal frame image and the light-shielding frame image alternately in predetermined frame cycle T1. The following description is made assuming that in an initial state before the first frame image output processing is started, the voltage to be applied to photoelectric conversion member 111 corresponds to the second voltage (in this case, for example, 0 V).

The first frame image output processing is started when an operation indicating a start of capturing of a moving image is received by a user who uses imaging device 1.

Figure 7:
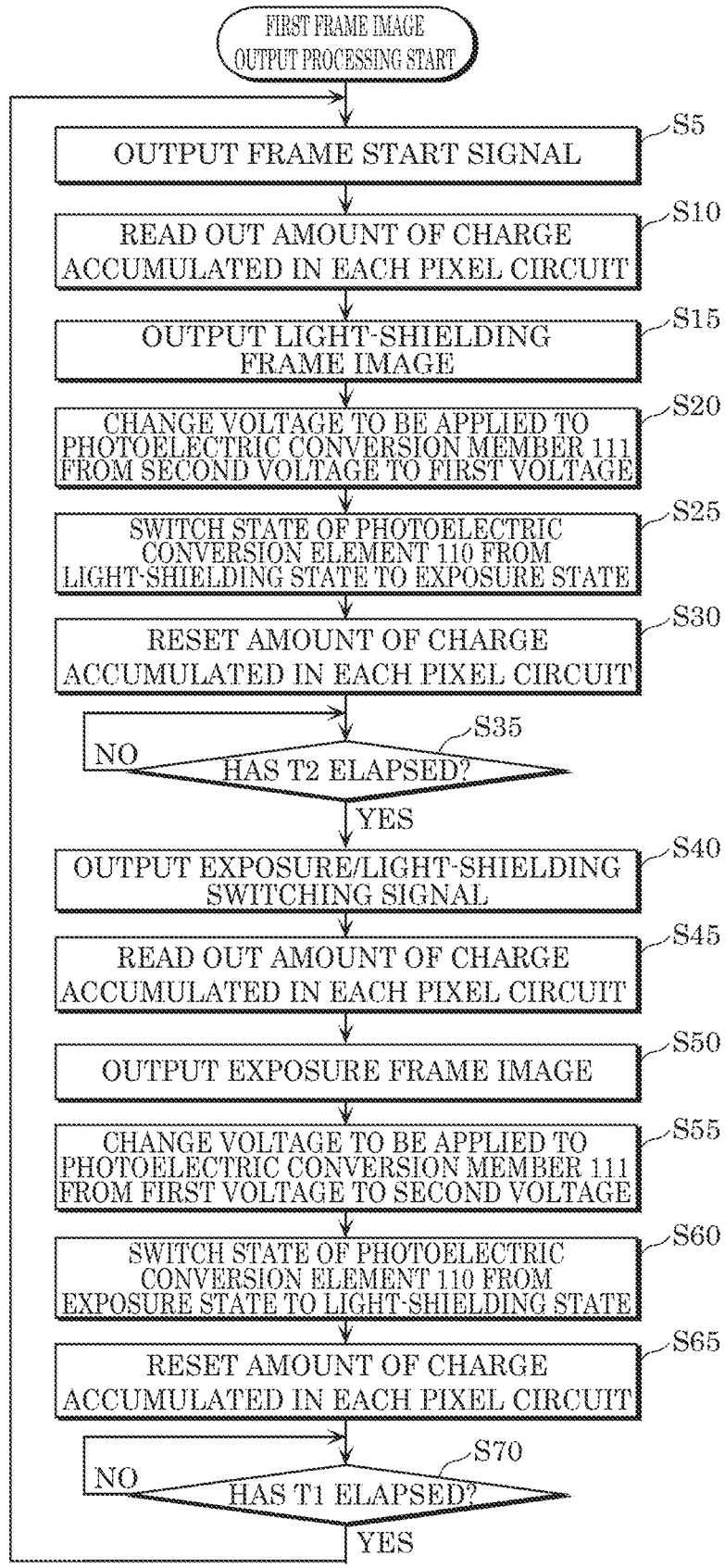
FIG. 7 is a flowchart illustrating first frame image output processing.

FIG. 7 is a flowchart illustrating the first frame image output processing.

When the first frame image output processing is started, voltage controller 20 outputs the frame start signal to imaging element 10 (step S5).

Upon receiving the frame start signal output from voltage controller 20, imaging element 10 reads out the amount of charge accumulated in charge accumulation node 25 of each pixel circuit 21 included in image circuit array 120 (step S10), and outputs the light-shielding frame image based on the read-out amount of charge (step S15).

Then, imaging element 10 changes the voltage to be applied to photoelectric conversion member 111 from the second voltage to the first voltage (in this case, for example, 10 V) (step S20).

As a result, the state of photoelectric conversion element 110 is switched from the light-shielding state to the exposure state (step S25).

Then, imaging element 10 resets the amount of charge accumulated in charge accumulation node 25 of each pixel circuit 21 included in pixel circuit array 120 (step S30).

On the other hand, after a lapse of predetermined period T2 after the previous frame start signal is output (step S35: Yes after the determination result in step S35 repeatedly indicates No), voltage controller 20 outputs the exposure light-shielding switching signal to imaging element 10 (step S40).

Upon receiving the exposure light-shielding switching signal output from voltage controller 20, imaging element 10 reads out the amount of charge accumulated in charge accumulation node 25 of each pixel circuit 21 included in pixel circuit array 120 (step S45), and outputs the exposure frame image based on the read-out amount of charge (step S50).

Then, imaging element 10 changes the voltage to be applied to photoelectric conversion member 111 from the first voltage to the second voltage (step S55).

As a result, the state of photoelectric conversion element 110 is switched from the exposure state to the light-shielding state (step S60).

Then, imaging element 10 resets the amount of charge accumulated in charge accumulation node 25 of each pixel circuit 21 included in pixel circuit array 120 (step S65).

On the other hand, after a lapse of predetermined period T1 after the previous frame start signal is output (step S70: Yes after the determination result in step S70 repeatedly indicates No), imaging element 10 proceeds to the processing of step S5 to repeatedly perform the subsequent processing.

[1-2-2. First Correction Processing]

The first correction processing is processing in which corrector 15 corrects the signal frame image output from imaging element 10 so as to reduce target dark current signal components by using the light-shielding frame image output from imaging element 10.

The first correction processing is started when a first light-shielding frame image is output from imaging element 10 in the above-described first frame image output processing.

Figure 8:
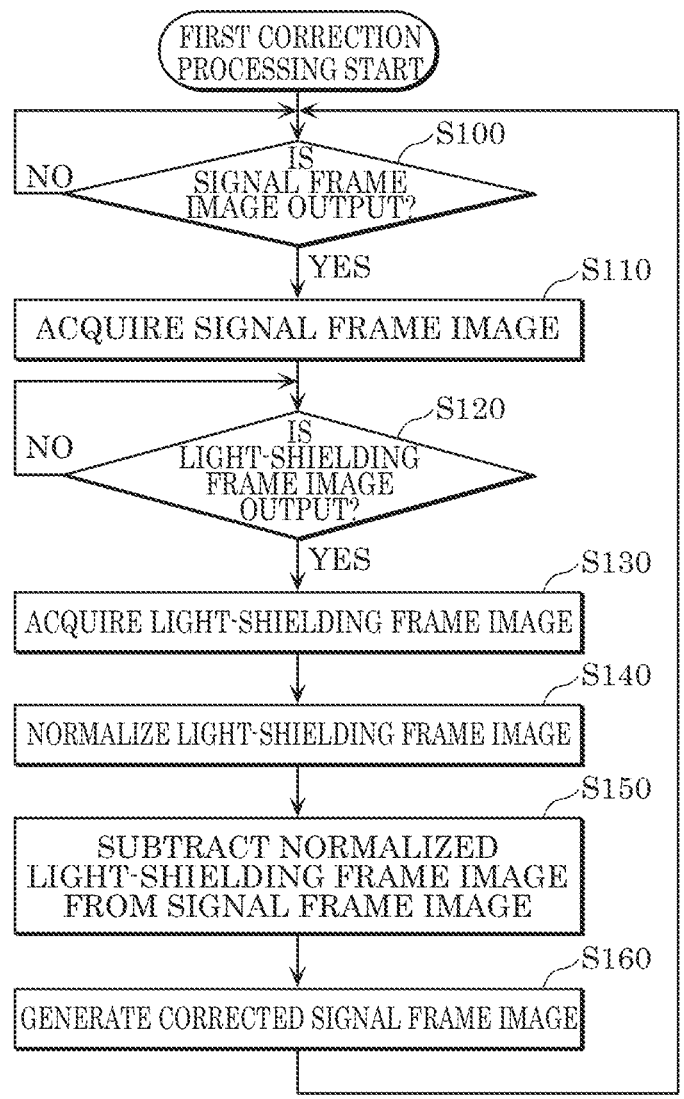
FIG. 8 is a flowchart illustrating first correction processing.

FIG. 8 is a flowchart illustrating the first correction processing.

When the first correction processing is started, corrector 15 waits until the signal frame image is output from imaging element 10. Then, when the signal frame image is output during the period in which corrector 15 waits for the output of the signal frame image (step S100: Yes after the determination result in step S100 repeatedly indicates No), corrector 15 acquires the signal frame image (step S110).

When the signal frame image is acquired, corrector 15 waits until the light-shielding frame image is output from imaging element 10. Then, when the light-shielding frame image is output during the period in which corrector 15 waits for the output of the light-shielding frame image (step S120: Yes after the determination result in step S120 repeatedly indicates No), corrector 15 acquires the light-shielding frame image (step S130).

Then, corrector 15 performs normalization processing on the acquired light-shielding frame image to generate a normalized light-shielding frame image (step S140). Specifically, corrector 15 multiplies each pixel value of the acquired light-shielding frame image by the value of (Tr/Ts) to thereby generate the normalized light-shielding frame image.

When the normalized light-shielding frame image is generated, corrector 15 subtracts the pixel value of each pixel in the normalized light-shielding frame image from the corresponding pixel value of each pixel in the acquired signal frame image (step S150), thereby generating a corrected signal frame image (step S160).

After the processing of step S160 is finished, corrector 15 proceeds to the processing of step S100 to repeatedly perform the subsequent processing.

[1-3. Effects and the Like]

As described above, imaging device 1 performs correction on the signal frame image output from imaging element 10 in predetermined frame cycle T1 so as to reduce dark current signal components by using the light-shielding frame image output from imaging element 10 in the same frame cycle.

In general, dark current signal components vary depending on the temperature or the like of the imaging element. Accordingly, if the temperature or the like of the imaging element varies during the image capturing period of capturing successive frame images, dark current signal components also vary. Therefore, imaging device 1 according to the present embodiment is capable of reducing dark current signal components included in frame images captured during the image capturing period of capturing successive signal frame images with accuracy higher than that in the imaging device of the related art that cannot acquire dark current signal components during the image capturing period.

Modified Example 1

An imaging device according to Modified Example 1 in which some of the functions of imaging device 1 according to the embodiment are changed will now be described with reference to the accompanying drawings.

Imaging device 1 according to the embodiment is a configuration example in which corrector 15 multiplies each pixel value of the light-shielding frame image for correction by the value of (exposure period Tr)/(light-shielding period Ts), thereby generating a normalized light-shielding frame image, and subtracts the pixel value of each pixel of the normalized light-shielding frame image from the corresponding pixel value of the correction target signal frame image, thereby generating a corrected signal frame image.

On the other hand, the imaging device according to Modified Example 1 is a configuration example in which a length of exposure period Tr and a length of light-shielding period Ts are equally set, and the corrector directly subtracts each pixel of the light-shielding frame image for correction from the corresponding pixel value of the correction target signal frame image, thereby generating a corrected signal frame image.

Differences between the imaging device according to Modified Example 1 and imaging device 1 according to the embodiment will be mainly described below with reference to the accompanying drawings.

[2-1. Configuration]

Figure 9:
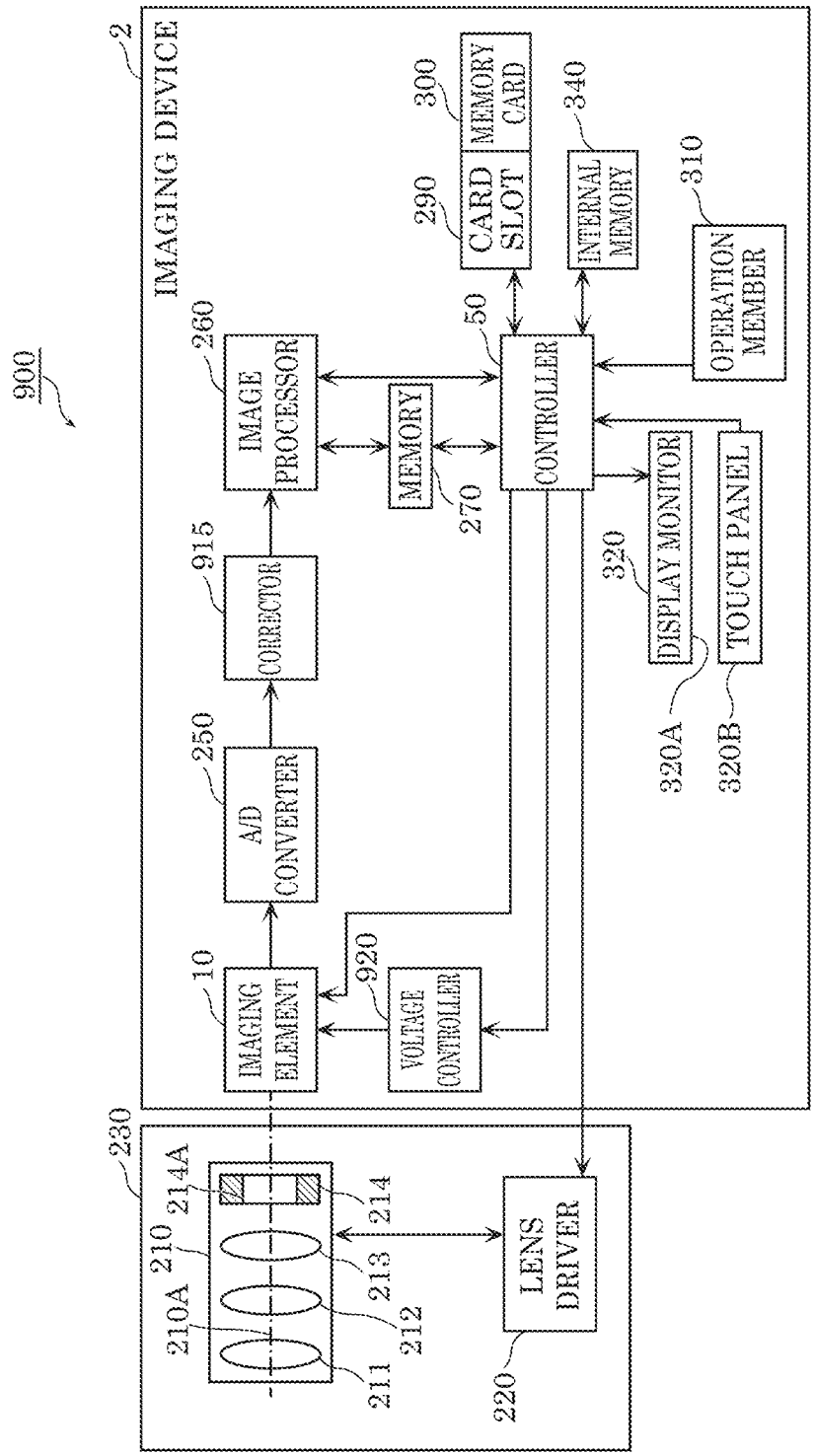
FIG. 9 is a block diagram illustrating a configuration of a camera according to Modified Example 1.

FIG. 9 is a block diagram illustrating a configuration of camera 900 according to Modified Example 1.

As illustrated in the figure, camera 900 differs from camera 200 according to the embodiment in that imaging device 1 is replaced by imaging device 2. Imaging device 2 also differs from imaging device 1 according to the embodiment in that corrector 15 is replaced by corrector 915 and voltage controller 20 is replaced by voltage controller 920.

Voltage controller 920 is modified from voltage controller 20 according to the embodiment so that some of the functions of voltage controller 20 are changed.

Voltage controller 20 according to the embodiment is a configuration example in which the voltage to be applied to photoelectric conversion member 111 is controlled by outputting the frame start signal to imaging element 10 in frame cycle T1, and then by outputting the exposure light-shielding switching signal in frame cycle T1 in which the phase is delayed by predetermined period T2 from the output of the frame start signal.

On the other hand, voltage controller 920 is a configuration example in which the voltage to be applied to photoelectric conversion member 111 is controlled by outputting the frame start signal to imaging element 10 in frame cycle T1, and then by outputting the exposure light-shielding switching signal in frame cycle T1 in which the phase is delayed by T½ from the output of the frame start signal.

Figure 10A:
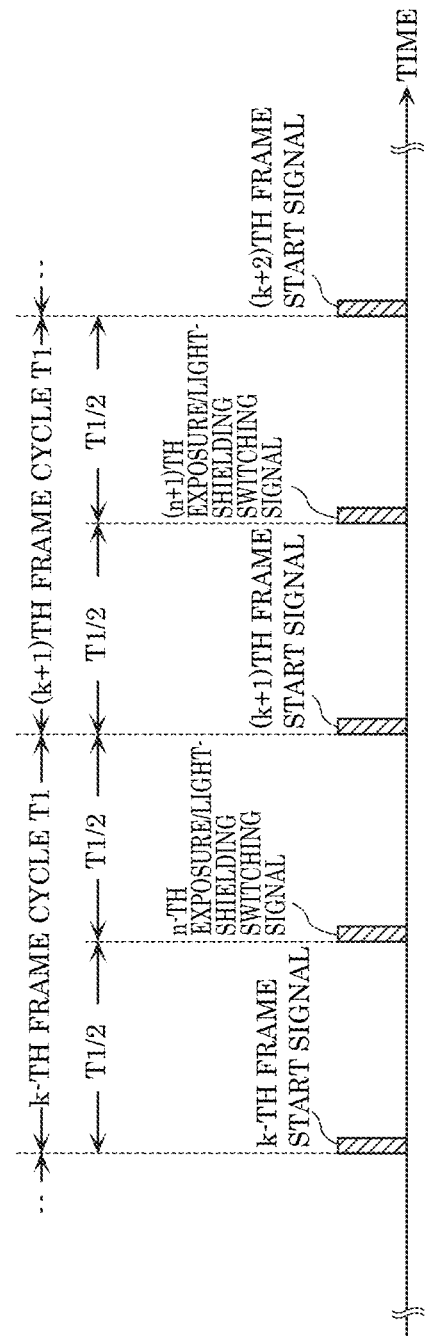
FIG. 10A is a timing diagram illustrating an operation of the voltage controller.
Figure 10B:
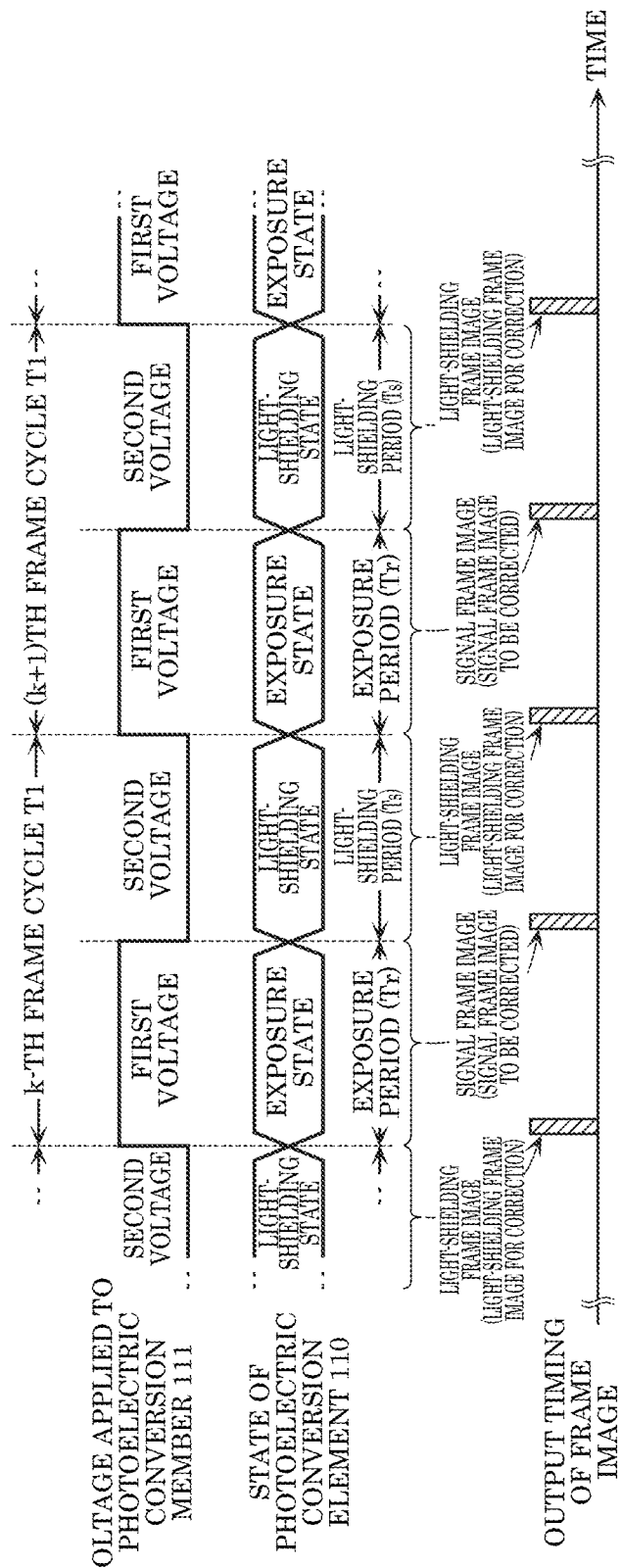
FIG. 10B is a timing diagram illustrating an operation of the imaging element.

FIG. 10A is a timing diagram illustrating the frame start signal and the exposure light-shielding switching signal output from voltage controller 920. FIG. 10B is a timing diagram illustrating an operation of imaging element 10 when the frame start signal and the exposure light-shielding switching signal are received from voltage controller 920.

As illustrated in FIG. 10A, voltage controller 920 outputs the frame start signal and the exposure light-shielding switching signal to imaging element 10 every frame cycle T1 at a timing when the exposure light-shielding switching signal is delayed by T½ from the frame start signal.

As illustrated in FIG. 10B, upon receiving the frame start signal and the exposure light-shielding switching signal output from voltage controller 920 every frame cycle T1, imaging element 10 applies the first voltage to photoelectric conversion member 111 during a period from a time when the frame start signal is received to a time when the subsequent exposure light-shielding switching signal is received, and imaging element 10 applies the second voltage to photoelectric conversion member 111 during a period from a time when the exposure light-shielding switching signal is received to a time when the subsequent frame start signal is received.

Accordingly, photoelectric conversion element 110 is in the exposure state during a period from the reception of the frame start signal till the lapse of T½, and photoelectric conversion element 110 is in the light-shielding state during a period from a lapse of T½ till the reception of the subsequent frame start signal.

Then, in the exposure period in which photoelectric conversion element 110 is in the exposure state, imaging element 10 reads out the amount of charge accumulated in charge accumulation node 25 of each pixel circuit 21, and outputs the signal frame image based on the read-out amount of charge, and in the light-shielding period in which photoelectric conversion element 110 is in the light-shielding state, imaging element 10 reads out the amount of charge accumulated in charge accumulation node 25 of each pixel circuit 21, and outputs the signal frame image based on the read-out amount of charge.

Referring again to FIG. 9, the description of imaging device 2 is continued.

Some of the functions of corrector 915 are changed from those of corrector 15 according to the embodiment.

Corrector 15 according to the embodiment is a configuration example in which each pixel value of the light-shielding frame image for correction is multiplied by the value of (exposure period Tr)/(light-shielding period Ts), thereby generating a normalized light-shielding frame image, and the pixel value of each pixel of the normalized light-shielding frame image is subtracted from the corresponding pixel value of the correction target signal frame image, thereby generating a corrected signal frame image.

On the other hand, corrector 915 is a configuration example in which each pixel of the light-shielding frame image for correction is directly subtracted from the corresponding pixel of the correction target signal frame image, thereby generating a corrected signal frame image.

Figure 11:
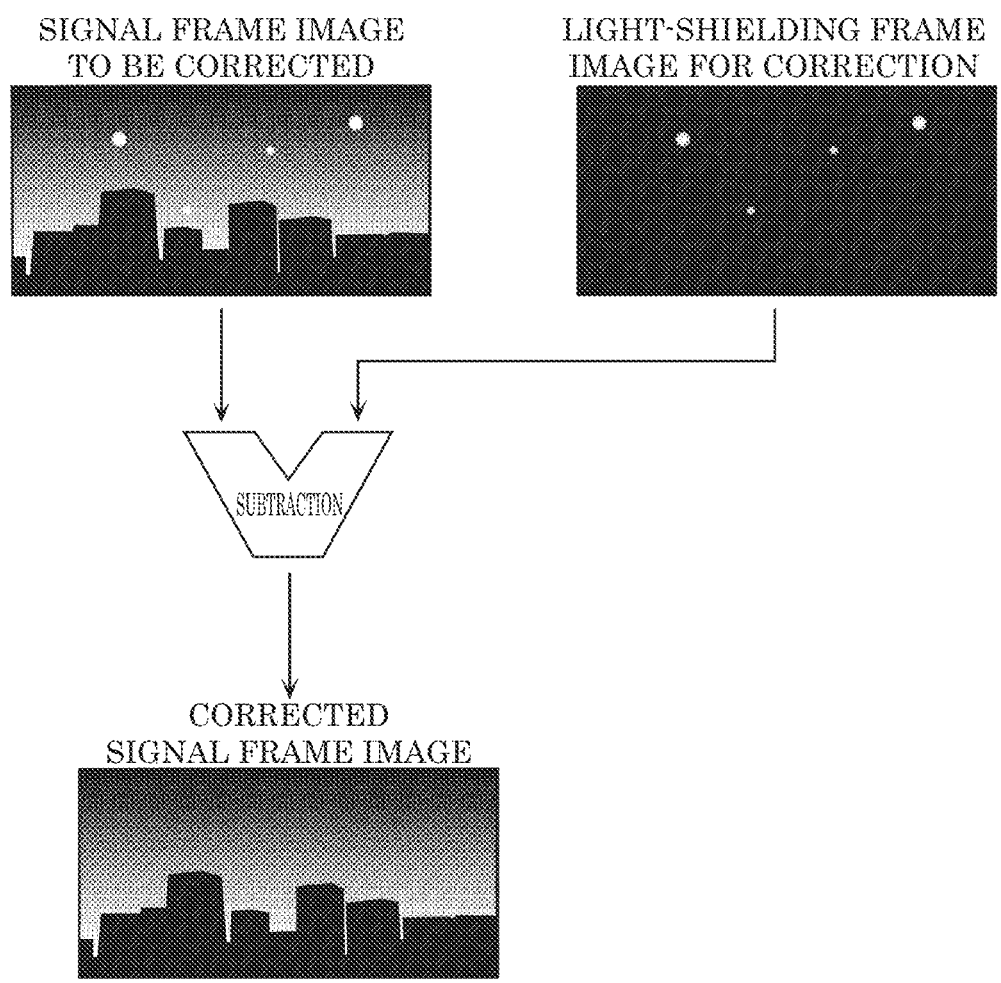
FIG. 11 is a schematic diagram illustrating a state where the corrector performs correction.

FIG. 11 is a schematic view illustrating a state where corrector 915 performs correction.

As illustrated in the figure, corrector 915 subtracts each pixel value of the light-shielding frame image for correction from the corresponding pixel value of the correction target signal frame, thereby generating a corrected signal frame image.

In imaging device 2, a length of exposure period Tr and a length of light-shielding period Ts are equally set. Accordingly, corrector 915 need not perform initialization processing on the light-shielding frame image for correction to initialize light-shielding period Ts with exposure period Tr in each frame cycle, unlike corrector 15 according to the embodiment.

An operation to be performed by imaging device 2 having the configuration described above will be described below with reference to the accompanying drawings.

[2-2. Operation]

Imaging device 2 performs, as characteristic operations, second frame image output processing and second correction processing.

These processing steps will be sequentially described below.

[2-2-1. Second Frame Image Output Processing]

The second frame image output processing is processing in which imaging element 10 alternately outputs the signal frame image and the light-shielding frame image at predetermined frame cycle T1 with phases shifted from each other by T½.

The second frame image output processing is processing in which a part of the first frame image output processing according to the embodiment is changed.

Figure 12:
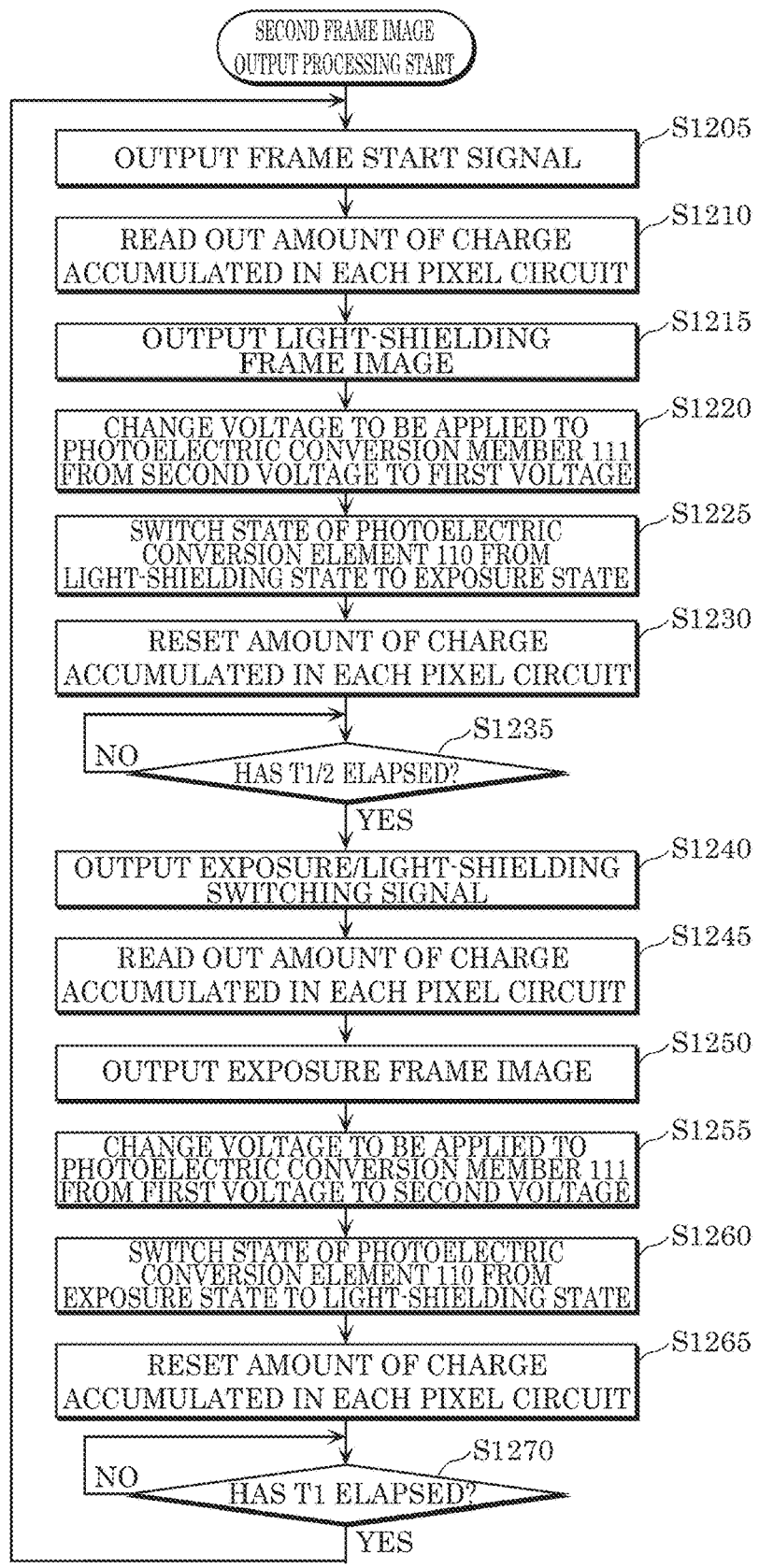
FIG. 12 is a flowchart illustrating second frame image output processing.

FIG. 12 is a flowchart illustrating the second frame image output processing.

In the figure, the processing of step S1205 to the processing of step S1230 correspond to the processing of step S5 to the processing of step S30 in the first frame image output processing according to the embodiment (see FIG. 7) in which voltage controller 20 is replaced by voltage controller 920, and the processing of step S1240 to the processing of step S1270 correspond to the processing of step S40 to the processing of step S79 in the first frame image output processing according to the embodiment (see FIG. 7) in which voltage controller 20 is replaced by voltage controller 920.

Accordingly, since the processing of step S1205 to the processing of step S1230 and the processing of step S1240 to the processing of step S1270 have been described above, only the processing of step S1235 and processing steps before and after the processing of step S1235 will now be described.

After the processing of step S1230 is finished, after a lapse of T½ since the previous frame start signal is output (step S1235: Yes after the determination result in step S1235 repeatedly indicates No), voltage controller 920 outputs an exposure switching signal to imaging element 10 (step S1240).

[2-2-2. Second Correction Processing]

The second correction processing is processing in which corrector 915 performs correction on each pixel of the signal frame image output from imaging element 10 so as to reduce dark current components from the target signal frame image by directly subtracting the corresponding pixels of the light-shielding frame image.

The second correction processing is processing in which a part of the first correction processing according to the embodiment is changed.

Figure 13:
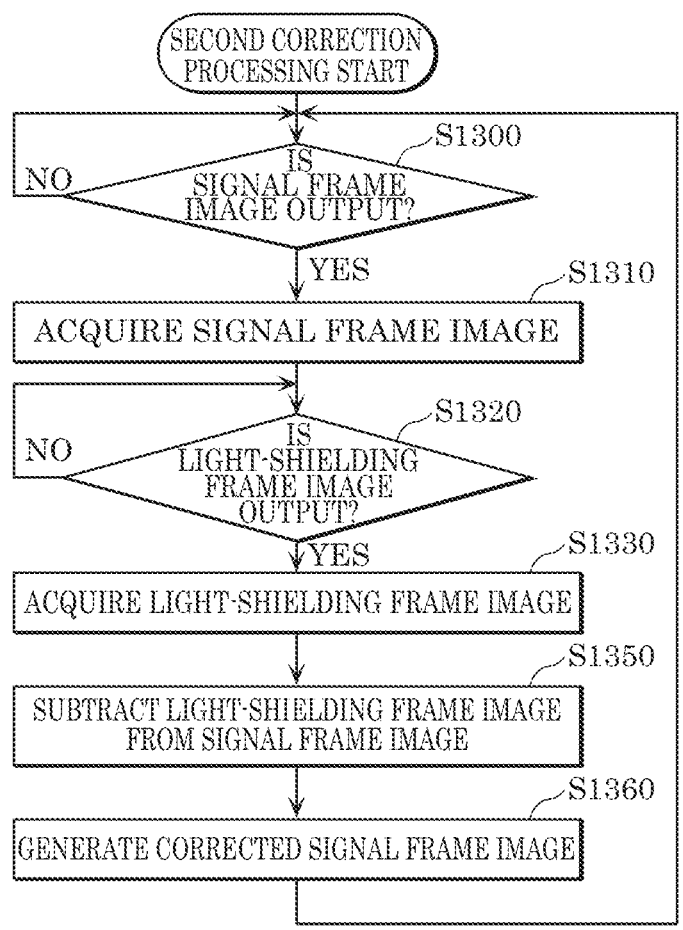
FIG. 13 is a flowchart illustrating second correction processing.

FIG. 13 is a flowchart illustrating the second correction processing.

In the figure, the processing of step S1300 to the processing of step S1330 and the processing of step S1360 correspond to the processing of step S100 to the processing of step S130 in the first correction processing according to the embodiment (see FIG. 8) in which corrector 15 is replaced by corrector 915.

Further, in the second correction processing, the processing corresponding to step S140 in the first correction processing according to the embodiment is omitted.

Accordingly, since the processing of step S1300 to the processing of step S1330 and the processing of step S1360 have been described above, only the processing of step S1350 and the processing steps before and after the processing of step S1350 will now be described.

In the processing of step S1330, upon receiving the light-shielding frame image, corrector 915 subtracts each pixel value of the light-shielding frame image from the corresponding pixel value of each pixel of the acquired signal frame image (step S1350), thereby generating a corrected signal frame image (step S1360).

[2-3. Effects and the Like]

As described above, in imaging device 2, corrector 915 directly subtracts each pixel value of the light-shielding frame image for correction from the corresponding pixel value of the correction target signal frame image, thereby generating a corrected signal frame image.

Therefore, imaging device 2 according to Modified Example 1 can achieve the correction of the signal frame image with a smaller amount of calculation than that of imaging device 1 according to the embodiment.

Modified Example 2

An imaging device according to Modified Example 2 in which some of the functions of imaging device 1 according to the embodiment are changed will now be described with reference to the accompanying drawings.

Imaging device 1 according to the embodiment is a configuration example in which the correction target signal frame is corrected using the light-shielding frame image output in the same frame cycle as the frame cycle in which the correction target signal frame is output.

On the other hand, the imaging device according to Modified Example 2 is a configuration example in which the correction target signal frame is corrected using the light-shielding frame image output in a plurality of frame cycles including the frame cycle in which the correction target signal frame is output.

Differences between the imaging device according to Modified Example 2 and imaging device 1 according to the embodiment will be mainly described below with reference to the accompanying drawings.

[3-1. Configuration]

Figure 14:
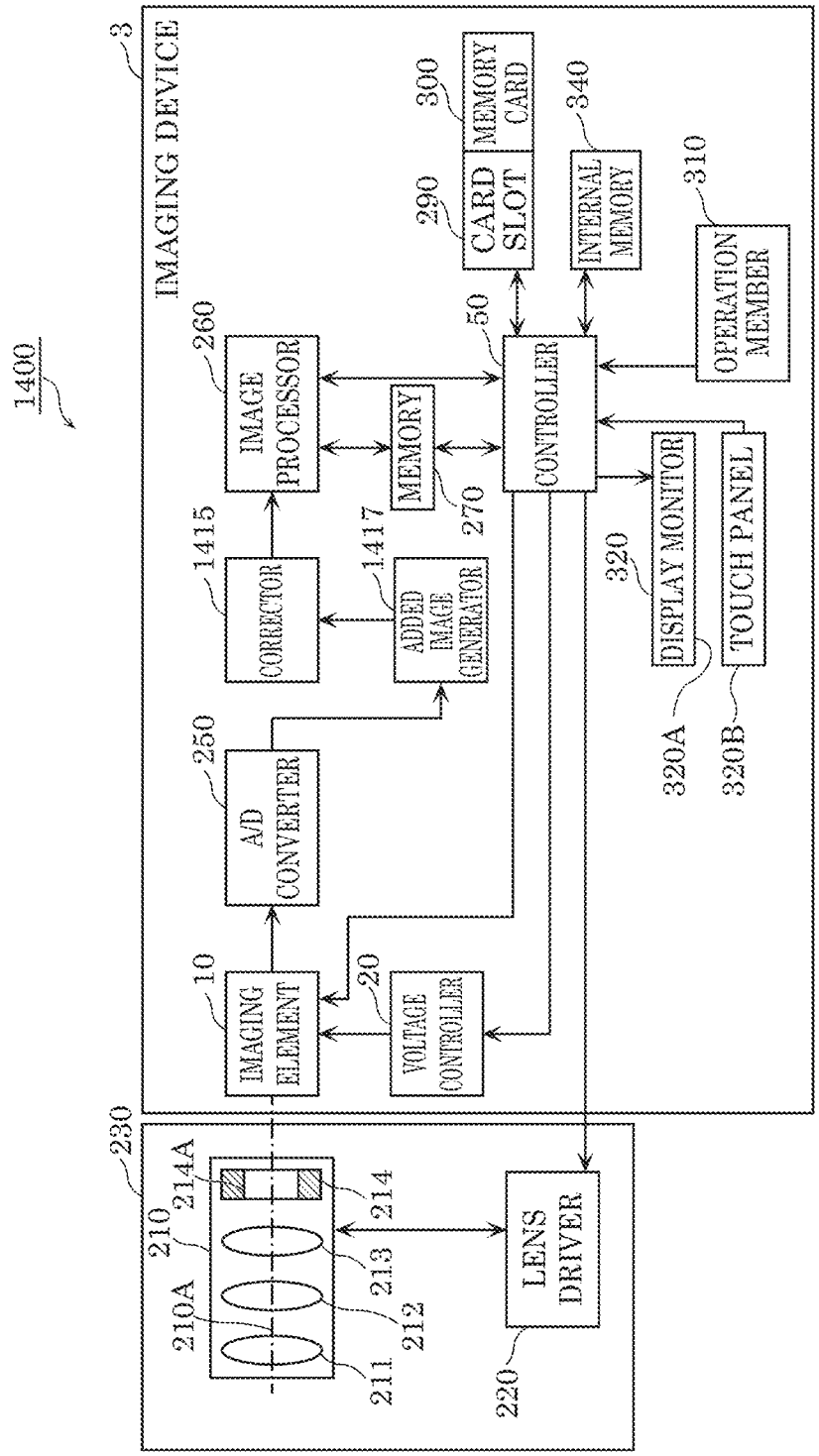
FIG. 14 is a block diagram illustrating a configuration of an imaging device according to Modified Example 2.

FIG. 14 is a block diagram illustrating a configuration of camera 1400 according to Modified Example 2.

As illustrated in the figure, camera 1400 has a configuration in which imaging device 1 in camera 200 according to the embodiment is replaced by imaging device 3. Further, the configuration of imaging device 3 differs from the configuration of imaging device 1 according to the embodiment in that corrector 15 is replaced by corrector 1415 and added image generator 1417 is added.

Added image generator 1417 adds pixel values of corresponding pixels in a plurality of light-shielding frame images output from imaging element 10, thereby generating an added light-shielding frame image.

Figure 15:
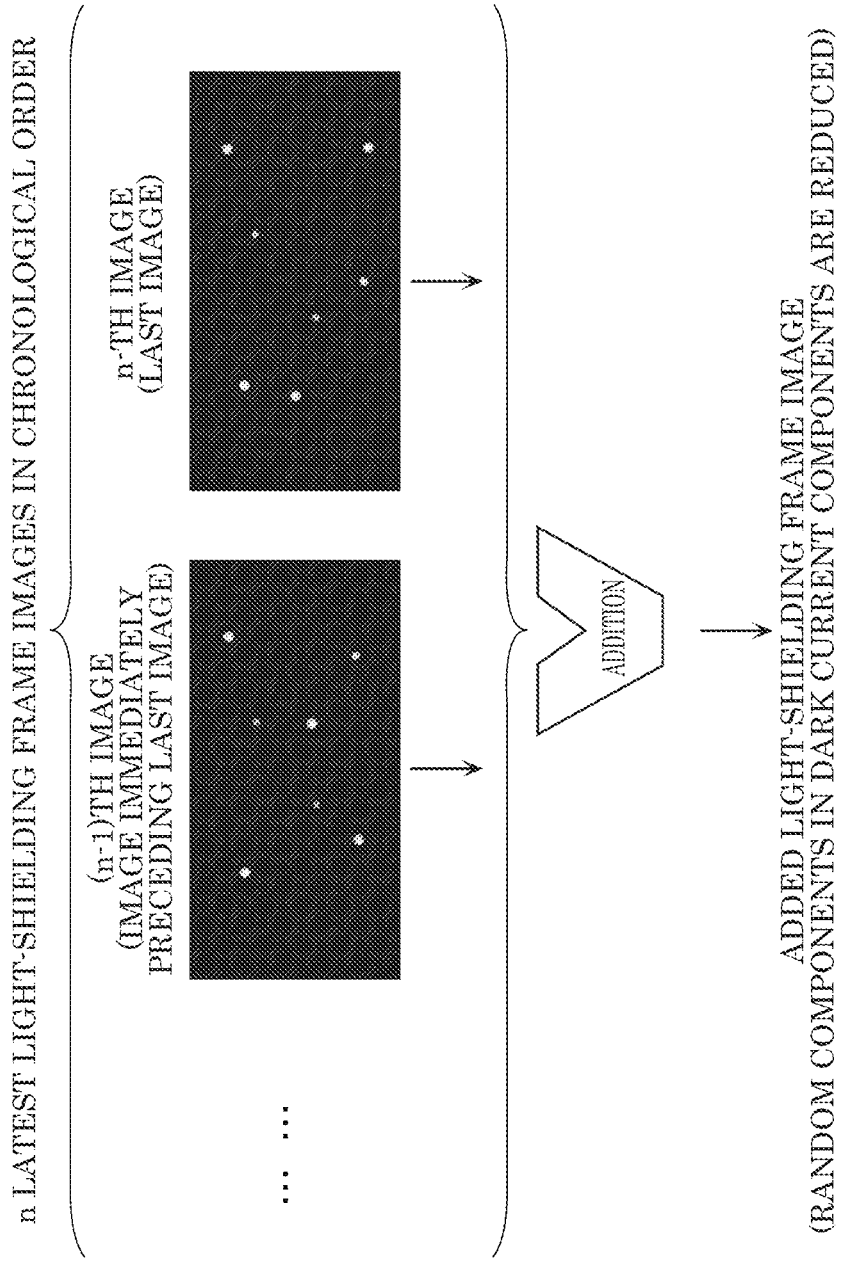
FIG. 15 is a schematic diagram illustrating a state where an added image generator generates an added light-shielding frame image.

FIG. 15 is a schematic view illustrating a state where added image generator 1417 generates the added light-shielding frame image.

As illustrated in the figure, when a new light-shielding frame image is output from imaging element 10, added image generator 1417 adds pixel values of corresponding pixels to n (n is an integer equal to or greater than 2) latest light-shielding frame images in a chronological order that include the newly output light-shielding frame image and are output from imaging element 10, thereby generating the added light-shielding frame image. As a result, in the n light-shielding frame images, the dark current signal component located at the same positions (that is, at the same pixel) is added as the dark current signal component at the corresponding position (that is, at the corresponding pixel) in the added light-shielding frame image. Accordingly, as illustrated in FIG. 15, in the n light-shielding frame images, a so-called "white flaw" that appears at the same position appears as a brightness white flaw at which the brightness of the white flaw in each light-shielding frame image is added at the corresponding position in the added light-shielding frame image.

On the other hand, in the n light-shielding frame images, random noise ("random components") generated at different positions (that is, at different pixels) corresponding to one image is added in the added light-shielding frame image. Accordingly, the random noise appears as brightness sufficiently lower than that of the "white flaw" at which the brightness in the n light-shielding frame images is added, and thus the random noise is hardly noticeable. In other words, in the added light-shielding frame image, the "random components" are reduced as compared with the "white flaw". Even if the random noise occurs at the same position in a plurality of light-shielding frame images among the n light-shielding frame images, the random noise is negligible because the number of images in which the random noise occurs is smaller than the number of images in which the "white flaw" occurs.

Referring again to FIG. 14, the description of imaging device 3 is continued.

Corrector 1415 has a configuration in which some of the functions of corrector 15 according to the embodiment are changed.

Corrector 15 according to the embodiment is a configuration example in which the correction target signal frame is corrected using the light-shielding frame image output in the same frame cycle as the frame cycle in which the correction target signal frame is output.

On the other hand, corrector 1415 is a configuration example in which the correction target signal frame is corrected using the added light-shielding frame image output from added image generator 1417 that includes the light-shielding frame image output in the same frame cycle as the frame cycle in which the correction target signal frame is output as an image to be added.

Figure 16:
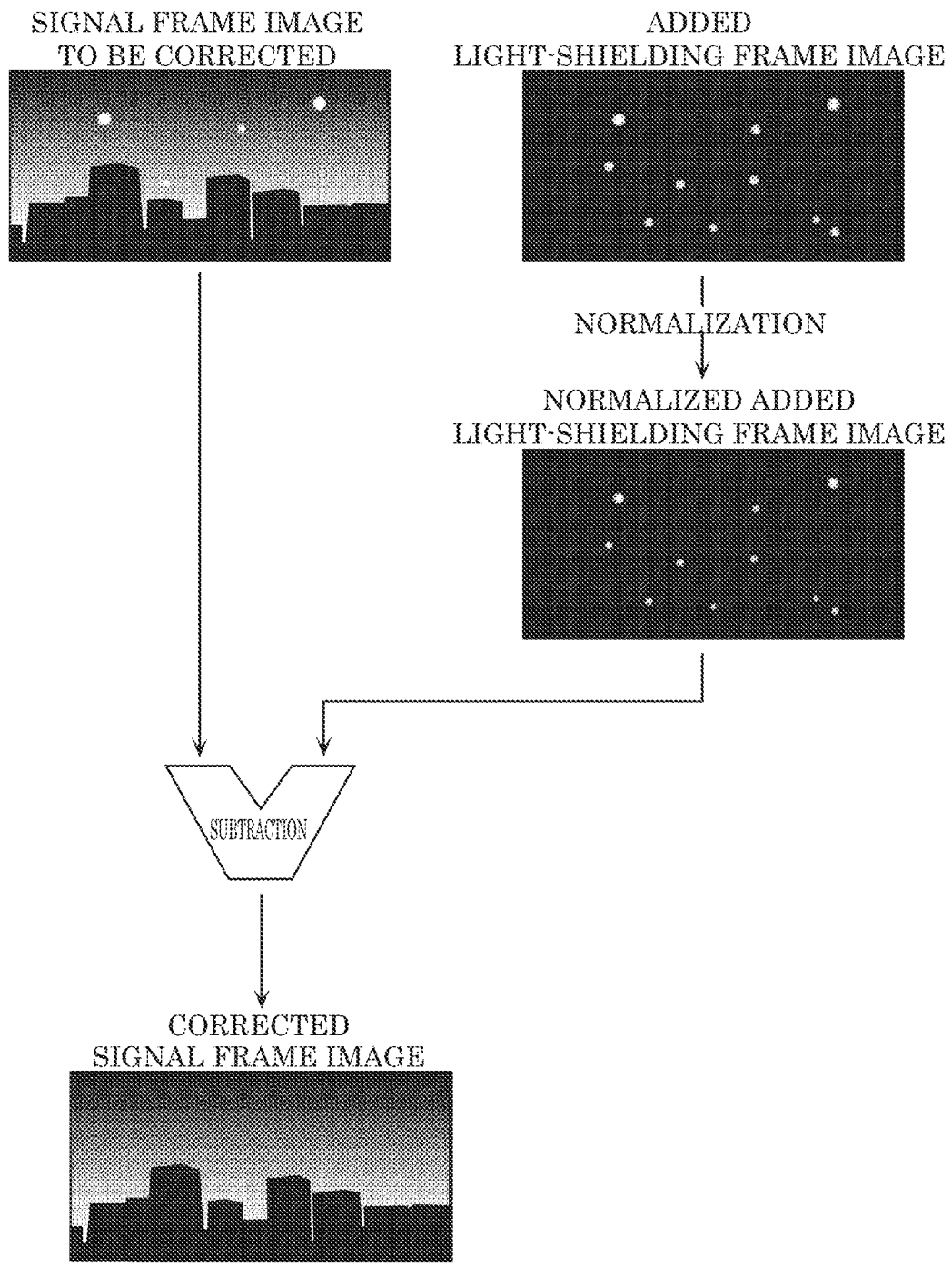
FIG. 16 is a schematic diagram illustrating a state where the corrector performs correction.

FIG. 16 is a schematic view illustrating a state where corrector 1415 performs correction.

First, corrector 1415 performs normalization processing on the added light-shielding frame image to generate a normalized added light-shielding frame image. In this case, the normalization processing is processing for normalizing the sum (n×Ts) of light-shielding periods in the added light-shielding frame image with the exposure period (Tr) in the correction target signal frame image. More specifically, corrector 1415 multiplies each pixel value of the added light-shielding frame image by the value of (Tr/(n×Ts)), thereby generating a normalized added light-shielding frame image. Thus, the dark current signal components in the normalized added light-shielding frame image are a (Tr/(n× Ts))-fold of the dark current signal components in the added light-shielding frame image. Modified Example 2 illustrates an example in which Tr<(n×Ts) holds. Accordingly, as illustrated in FIG. 16, the brightness of the so-called "white flaw" and the brightness of the "random components" in the normalized added light-shielding frame image are lower than the brightness of the so-called "white flaw" and the brightness of the "random components" in the added light-shielding frame image. In this case, the brightness of the "random components" is sufficiently lower than the brightness of the "white flaw", and thus the absolute value can be reduced by normalization. Further, for example, when a threshold in which the "random components" are not included is set for the brightness level for normalization processing and the brightness equal to or less than the threshold is indicated by "0", the "random components" can be further reduced.

Then, corrector 1415 subtracts the pixel value of each pixel in the normalized added light-shielding frame from the corresponding pixel value of each pixel of the correction target signal frame image, thereby generating a corrected signal frame image.

An operation to be performed by imaging device 3 having the configuration described above will be described below with reference to the accompanying drawings.

[3-2. Operation]

Imaging device 3 performs, as characteristic operations, first frame image output processing and third correction processing.

The first frame image output processing has been described above in the embodiment. Accordingly, the third correction processing will now be described.

[3-2-1. Third Correction Processing]

The third correction processing is processing in which corrector 1415 performs correction on the signal frame image output from imaging element 10 so as to reduce dark current signal components by using the added light-shielding frame image output from added image generator 1417.

The third correction processing is started when the (n−1)th light-shielding frame image is output from imaging element 10 in the first frame image output processing described above.

Figure 17:
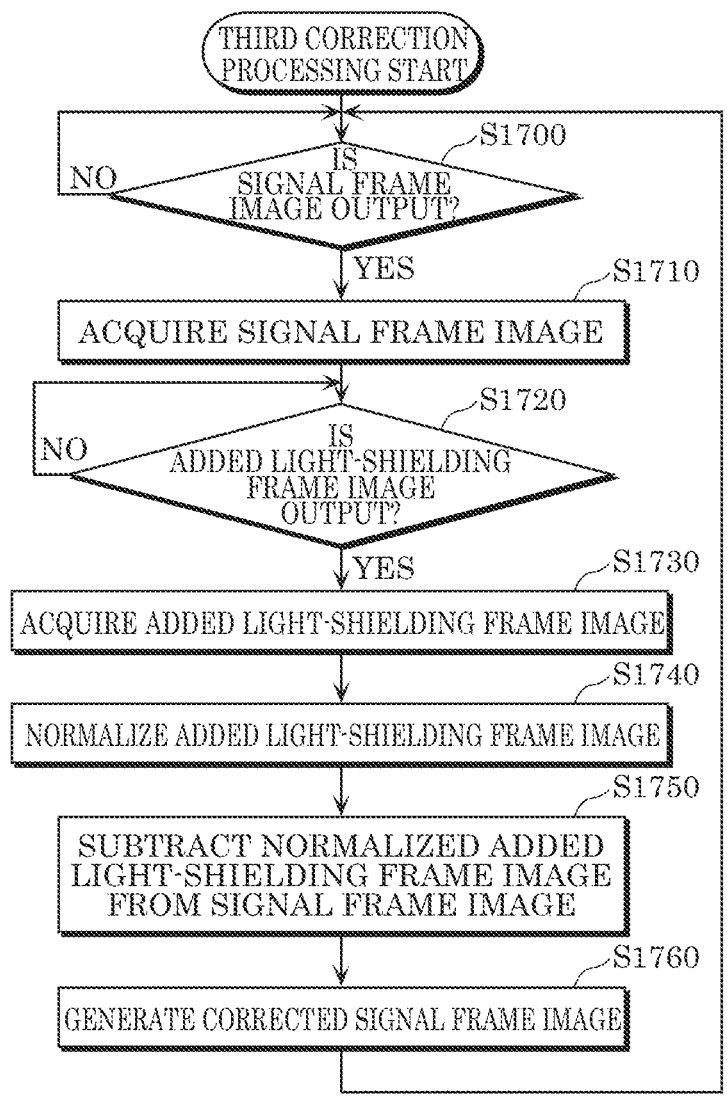
FIG. 17 is a flowchart illustrating third correction processing.

FIG. 17 is a flowchart illustrating the third correction processing.

When the third correction processing is started, corrector 1415 waits until the signal frame image is output from imaging element 10. Further, when the signal frame image is output during the period of waiting for output of the signal frame image (step S1700: Yes after the determination result in step S1700 repeatedly indicates No), corrector 1415 acquires the signal frame image (step S1710).

When the signal frame image is acquired, corrector 1415 waits until the added light-shielding frame image is output from added image generator 1417. Further, when the added light-shielding frame image is output during the period of waiting for output of the added light-shielding frame image (step S1720: Yes after the determination result in step S1720 repeatedly indicates No), corrector 1415 acquires the added light-shielding frame image (step S1730).

Further, corrector 1415 performs normalization processing on the acquired added light-shielding frame image to generate a normalized added light-shielding frame image (step S1740). Specifically, corrector 15 multiplies each pixel value of the acquired added light-shielding frame image by the value of (Tr/(n·Ts)), thereby generating a normalized added light-shielding frame image.

When the normalized added light-shielding frame image is generated, corrector 1415 subtracts the pixel value of each pixel of the normalized added light-shielding frame image from the corresponding pixel value of each pixel of the acquired signal frame image (step S1750), thereby generating a corrected signal frame image (step S1760).

After the processing of step S1760 is finished, corrector 1415 advances to the processing of step S1700 to repeatedly perform the subsequent processing.

[3-3. Effects and the Like]

As described above, in imaging device 3, the added light-shielding frame image generated by added image generator 1417 is an image in which random components of dark current components in the n light-shielding frame images are averaged and reduced.

Accordingly, imaging device 3 according to Modified Example 2 can achieve the correction of the signal frame image more accurately than in imaging device 1 according to the embodiment.

Modified Example 3

An imaging device according to Modified Example 3 in which some of the functions of imaging device 2 according to Modified Example 1 are changed will now be described with reference to the accompanying drawings.

Imaging device 2 according to Modified Example 1 is a configuration example in which a length of exposure period Tr and a length of light-shielding period Ts are equally set, and the pixel value of each pixel of the light-shielding frame image output in the same frame cycle as the frame cycle in which the correction target signal frame is output is directly subtracted from the corresponding pixel value of each pixel of the correction target signal frame image, to thereby generate a corrected signal frame image.

On the other hand, the imaging device according to Modified Example 3 is a configuration example in which a length of exposure period Tr and a length of light-shielding period Ts are equally set, like in the imaging device according to Modified Example 1, but the light-shielding frame image to be subjected to subtraction from the correction target signal frame is changed to an averaged light-shielding frame image obtained by performing averaging processing on each pixel of the light-shielding frame images output in a plurality of frame cycles including the frame cycle in which the correction target signal frame is output.

Differences between the imaging device according to Modified Example 3 and imaging device 2 according to Modified Example 1 will be mainly described below with reference to the accompanying drawings.

[4-1. Configuration]

Figure 18:
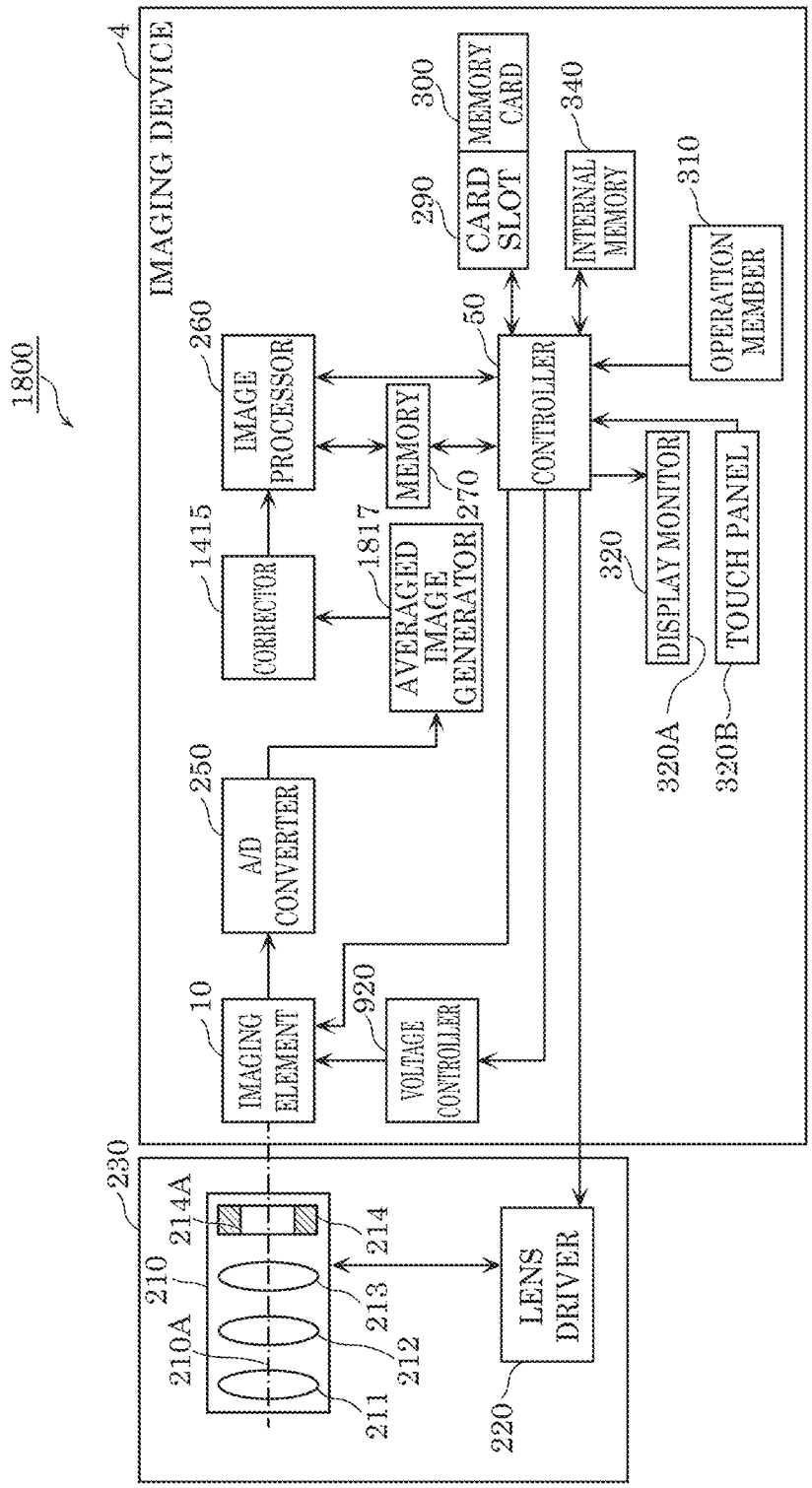
FIG. 18 is a block diagram illustrating a configuration of a camera according to Modified Example 3.

FIG. 18 is a block diagram illustrating a configuration of camera 1800 according to Modified Example 3.

As illustrated in the figure, camera 1800 differs from camera 900 according to Modified Example 1 in that imaging device 2 is replaced by imaging device 4. Further, imaging device 4 differs from imaging device 2 according to Modified Example 1 in that corrector 915 is replaced by corrector 1815 and averaged image generator 1817 is added.

Averaged image generator 1817 performs averaging processing on the pixel values of corresponding pixels in a plurality of light-shielding frame images output from imaging element 10, thereby generating an averaged light-shielding frame image.

Figure 19:
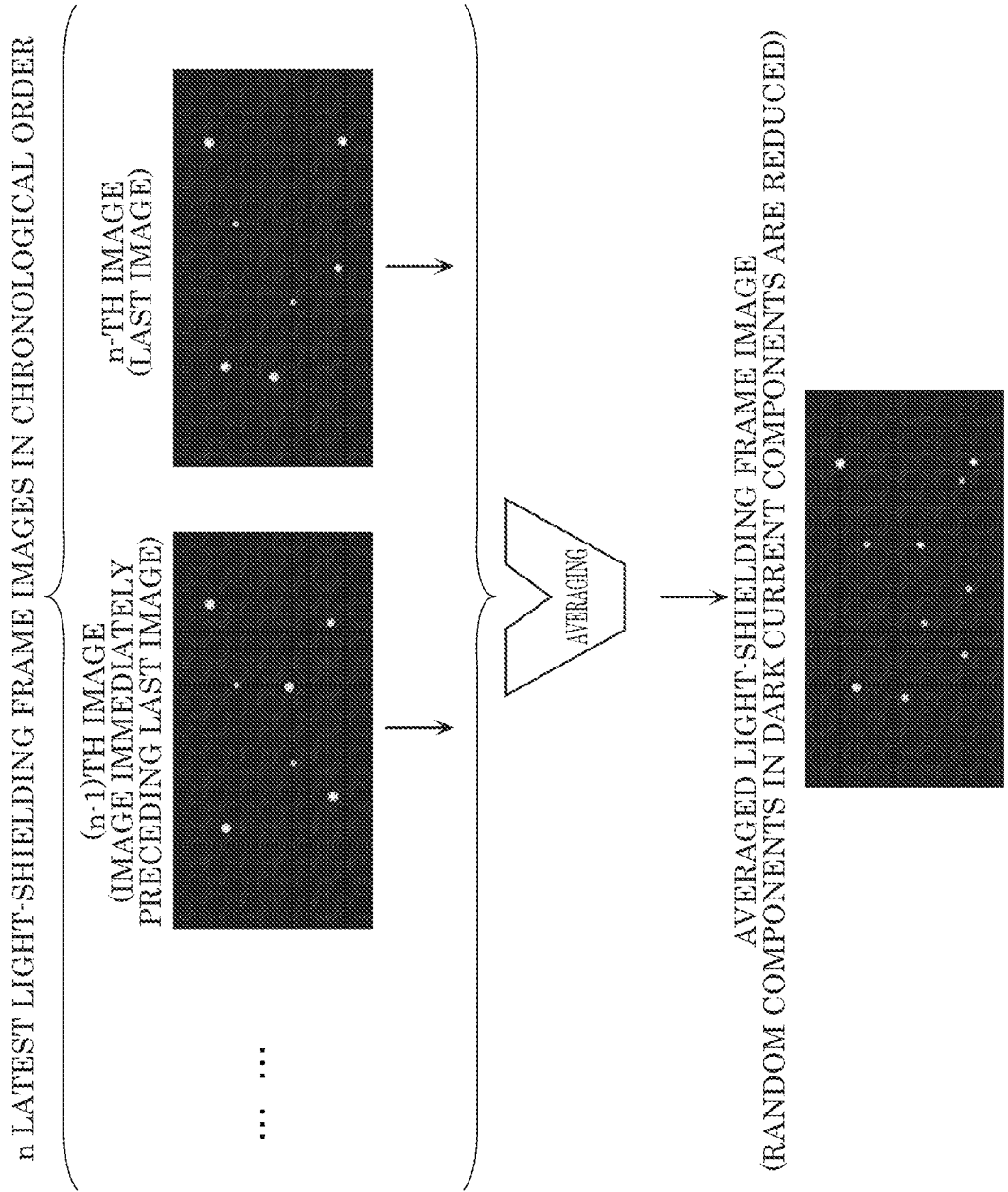
FIG. 19 is a schematic diagram illustrating a state where an averaged image generator generates an averaging light-shielding frame image.

FIG. 19 is a schematic view illustrating a state where averaged image generator 1817 generates the averaged light-shielding frame image.

As illustrated in the figure, when a new light-shielding frame image is output from imaging element 10, averaged image generator 1817 performs averaging processing on n (n is an integer equal to or greater than 2) latest light-shielding frame images in a chronological order that include the newly output light-shielding frame image and are output from imaging element 10, thereby generating an averaged light-shielding frame image. As a result, in the n light-shielding frame images, averaging processing is performed using the dark current signal component at the same position (that is, at the same pixel) as the dark current signal component as the dark current signal component at the corresponding position (that is, at the corresponding pixel) in the averaged light-shielding frame image. Accordingly, as illustrated in FIG. 19, in the n light-shielding frame images, a so-called "white flaw" that appears at the same position appears as a brightness "white flaw" at which the brightness of the white flaw in each light-shielding frame image is averaged at the corresponding position in the averaged light-shielding frame image. On the other hand, in the n light-shielding frame images, random noise ("random components") generated at different positions (that is, at different pixels) corresponding to one image is added in the averaged light-shielding frame image, and is multiplied by 1/n in the averaging processing. Accordingly, the random noise appears as brightness sufficiently lower than that of the "white flaw" at which the brightness in the n light-shielding frame images is added, and thus the random noise is hardly noticeable. Further, for example, when a threshold in which the "random components" are not included is set for the brightness level for averaging processing and the brightness equal to or less than the threshold is indicated by "0", the "random components" can be further reduced. Thus, the added light-shielding frame image generated by averaging processing is an image in which random components of dark current components in the n light-shielding frame images are reduced.

The averaged light-shielding frame image generated by averaged image generator 1817 as described above is an image in which random components of dark current components in the n light-shielding frame images are averaged and reduced.

Referring again to FIG. 18, the description of imaging device 4 is continued.

Corrector 1815 has a configuration in which some of the functions of corrector 915 according to Modified Example 1 are changed.

Corrector 915 according to Modified Example 1 is a configuration example in which the pixel value of each pixel of the light-shielding frame image output in the same frame cycle as the frame cycle in which the correction target signal frame is output is directly subtracted from the corresponding pixel value of each pixel of the correction target signal frame image, thereby generating a corrected signal frame image.

On the other hand, corrector 1815 is a configuration example in which the light-shielding frame image to be subjected to subtraction from the correction target signal frame is changed to an averaged light-shielding frame image that is output from averaged image generator 1817 and includes, as an averaging target, the light-shielding frame image output in the same frame cycle as the frame cycle in which the correction target signal frame is output.

Figure 20:
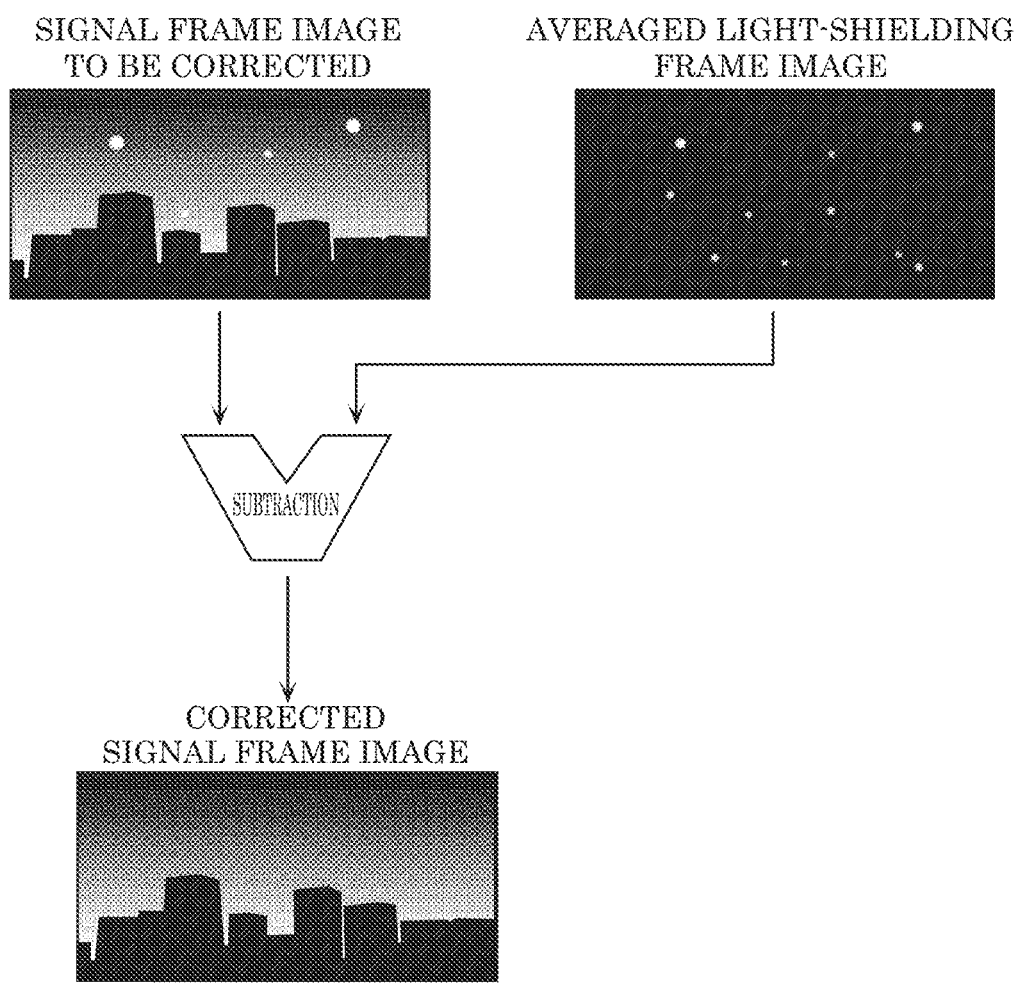
FIG. 20 is a schematic diagram illustrating a state where the corrector performs correction.

FIG. 20 is a schematic view illustrating a state where corrector 1815 performs correction.

As illustrated in the figure, corrector 1815 subtracts each pixel value of the averaged light-shielding frame image from the corresponding pixel value of each pixel in the correction target signal frame, thereby generating a corrected signal frame image.

An operation to be performed by imaging device 4 having the configuration described above will be described below with reference to the drawings.

[4-2. Operation]

Imaging device 4 performs, as characteristic operations, second frame image output processing and fourth correction processing.

The second frame image output processing has been described above in Modified Example 1. Accordingly, the fourth correction processing will now be described.

[4-2-1. Fourth Correction Processing]

The fourth correction processing is processing in which corrector 1815 performs correction by subtracting, from the pixel value of each pixel forming the signal frame image output from imaging element 10, the pixel value of the corresponding pixel forming the averaged light-shielding frame image generated by averaged image generator 1817, thereby reducing dark current signal components from the target signal frame image.

The fourth correction processing is started when the (n−1)th light-shielding frame image is output from imaging element 10 in the first frame image output processing described above.

Figure 21:
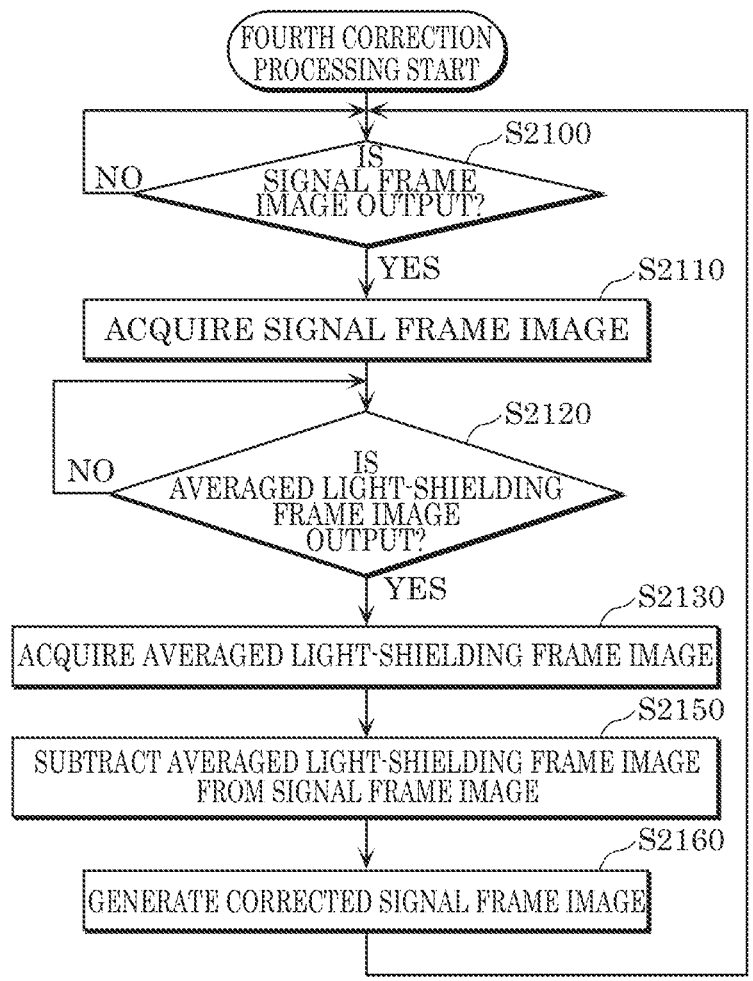
FIG. 21 is a flowchart illustrating fourth correction processing.

FIG. 21 is a flowchart illustrating the fourth correction processing.

When the fourth correction processing is started, corrector 1815 waits until the signal frame image is output from imaging element 10. Further, when the signal frame image is output during the period of waiting for output of the signal frame image (step S2100: Yes after the determination result in step S2100 repeatedly indicates No), corrector 1815 acquires the signal frame image (step S2110).

When the signal frame image is acquired, corrector 1815 waits until the averaged light-shielding frame image is output from averaged image generator 1817. Further, when the averaged light-shielding frame image is output during the period of waiting for output of the averaged light-shielding frame image (step S2120: Yes after the determination result in step S2120 repeatedly indicates No), corrector 1815 acquires the averaged light-shielding frame image (step S2130).

Further, corrector 1815 subtracts the pixel value of each pixel of the acquired averaged light-shielding frame image from the corresponding pixel value of each pixel of the acquired signal frame image (step S2150), thereby generating a corrected signal frame image (step S2160).

After the processing of step S2160 is finished, corrector 1815 advances the processing of step S2100 to repeatedly perform the subsequent processing.

[4-3. Effects and the Like]

As described above, in imaging device 4, the averaged light-shielding frame image generated by averaged image generator 1817 is an image in which random components of dark current components in the n light-shielding frame images are averaged and reduced.

Accordingly, imaging device 4 according to Modified Example 3 can achieve the correction of the signal frame image more accurately than in imaging device 2 according to Modified Example 1.

Modified Example 4

An imaging device according to Modified Example 4 having a configuration in which some of the functions of imaging device 3 according to Modified Example 2 are changed will now be described with reference to the accompanying drawings.

Imaging device 3 according to Modified Example 2 is a configuration example in which corrector 1415 multiplies each pixel value of the added light-shielding frame image obtained by adding the n light-shielding frame images by the value of (exposure period Tr)/(n×(light-shielding period Ts)), thereby generating a normalized added light-shielding frame image, and corrector 1415 subtracts the pixel value of each pixel of the normalized added light-shielding frame image from the corresponding pixel value of the correction target signal frame image, thereby generating a corrected signal frame image.

On the other hand, the imaging device according to Modified Example 4 is a configuration example in which exposure period Tr is set to be an n-fold of light-shielding period Ts, and the corrector subtracts each pixel value of the added light-shielding frame image from the corresponding pixel value of the correction target signal frame image, thereby generating a corrected signal frame image.

Differences between the imaging device according to Modified Example 4 and imaging device 3 according to Modified Example 2 will be mainly described below with reference to the accompanying drawings.

[5-1. Configuration]

Figure 22:
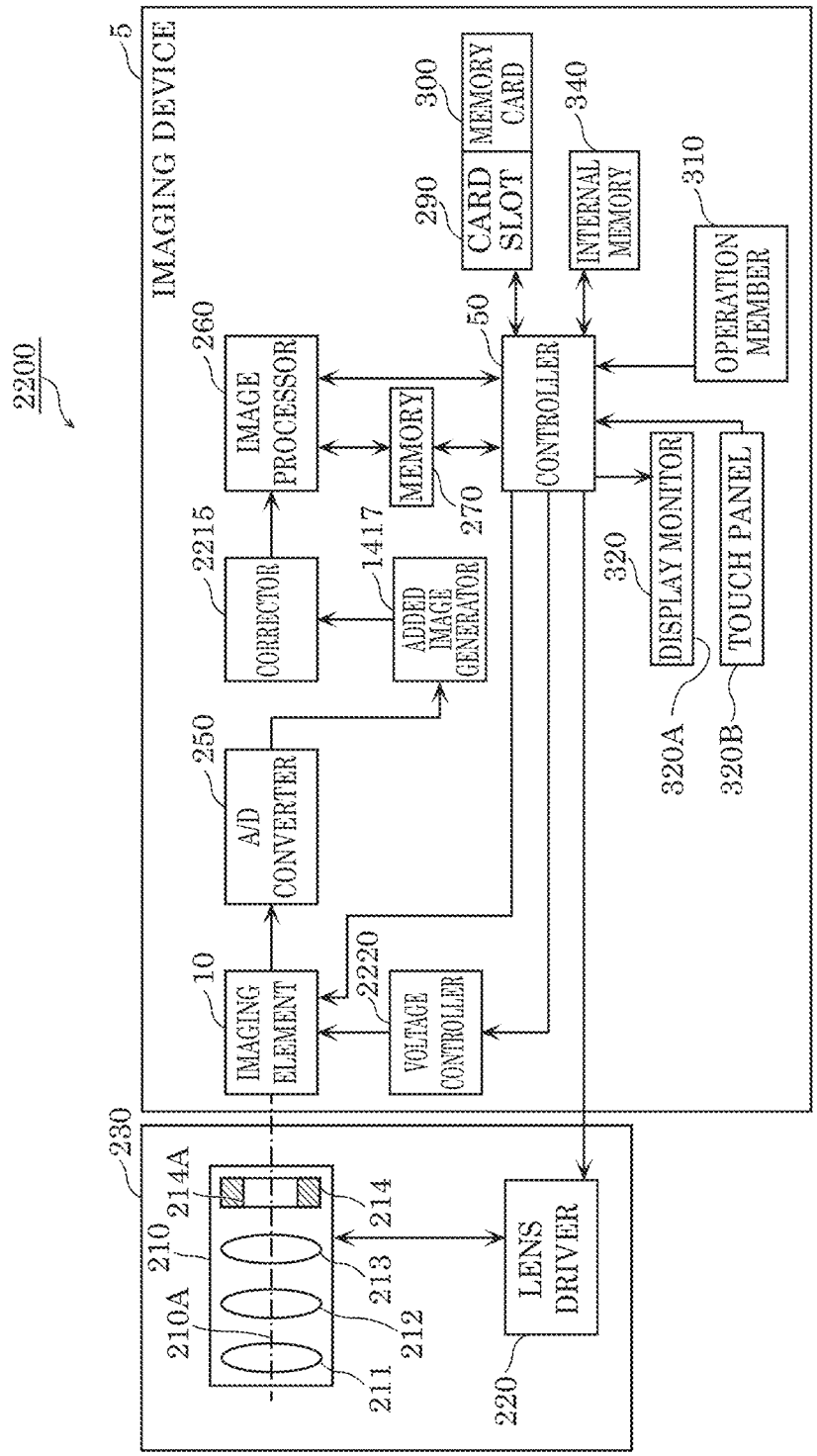
FIG. 22 is a block diagram illustrating a configuration of a camera according to Modified Example 4.

FIG. 22 is a block diagram illustrating a configuration of camera 2200 according to Modified Example 4.

As illustrated in the figure, camera 2200 differs from camera 1400 according to Modified Example 2 in that imaging device 3 is replaced by imaging device 5. Further, imaging device 5 differs from imaging device 3 according to Modified Example 2 in that corrector 1415 is replaced by corrector 2215 and voltage controller 20 is replaced by voltage controller 2220.

Voltage controller 2220 has a configuration in which some of the functions of voltage controller 20 according to Modified Example 2 are changed.

Voltage controller 20 according to Modified Example 2 is a configuration example in which the frame start signal is output to imaging element 10 at frame cycle T 1, and the voltage to be applied to photoelectric conversion member 111 is controlled by outputting an exposure light-shielding switching signal at frame cycle T1 with a phase delayed by predetermined period T2 from the frame start signal.

On the other hand, voltage controller 2220 is a configuration example in which the frame start signal is output to imaging element 10 at frame cycle T1, and the voltage to be applied to photoelectric conversion member 111 is controlled by outputting the exposure light-shielding switching signal at frame cycle T1 with a phase delayed by (n/(n+1))×T1 from the output of the frame start signal.

Figure 23A:
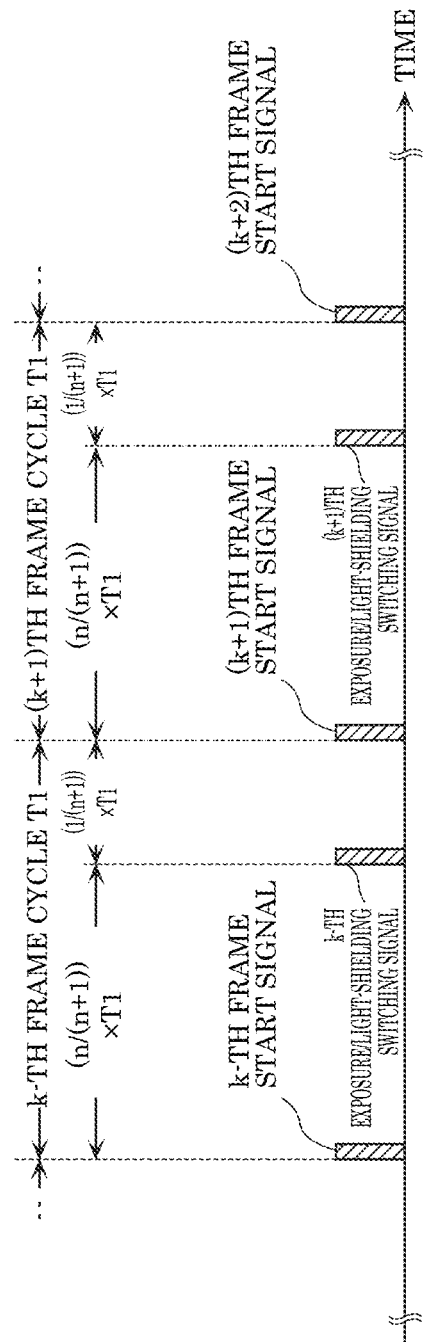
FIG. 23A is a timing diagram illustrating an operation of the voltage controller.

FIG. 23A is a timing diagram illustrating the frame start signal and the exposure light-shielding switching signal output from voltage controller 2220. Further, FIG. 23B is a timing diagram illustrating an operation of imaging element 10 when the frame start signal and the exposure light-shielding switching signal are received from voltage controller 2220.

As illustrated in FIG. 23A, voltage controller 2220 outputs the frame start signal and the exposure light-shielding switching signal to imaging element 10 every frame cycle T1 at a timing when the exposure light-shielding switching signal is delayed by (n/(n+1))×T1 from the frame start signal.

Figure 23B:
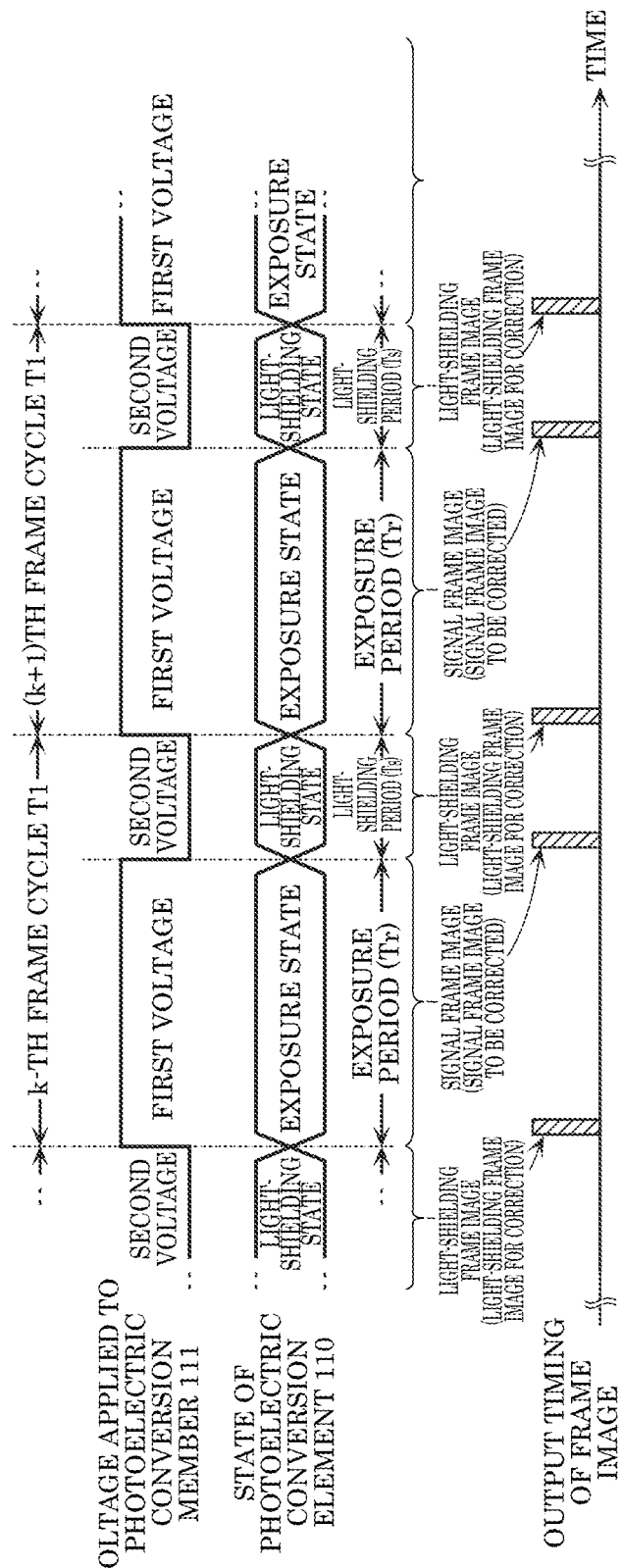
FIG. 23B is a timing diagram illustrating an operation of the imaging element.

As illustrated in FIG. 23B, upon receiving the frame start signal and the exposure light-shielding switching signal output from voltage controller 2220 every frame cycle T1, imaging element 10 applies a first voltage to photoelectric conversion member 111 during a period from a time when the frame start signal is received to a time when the subsequent exposure light-shielding switching signal is received, and then applies a second voltage to photoelectric conversion member 111 during a period from a time when the exposure light-shielding switching signal is received to a time when the subsequent frame start signal is received.

Accordingly, photoelectric conversion element 110 is brought into the exposure state during a period from a time when the frame start signal is received till a lapse of (n/(n+1))×T1, and is brought into the light-shielding state during a period from a time when (n/(n+1))×T1 has elapsed to a time when the subsequent frame start signal is received.

Further, imaging element 10 reads out the amount of charge accumulated in charge accumulation node 25 of each pixel circuit 21 during the exposure period in which photoelectric conversion element 110 is in the exposure state, and outputs the signal frame image based on the read-out amount of charge, and imaging element 10 reads out the amount of charge accumulated in charge accumulation node 25 of each pixel circuit 21 during the light-shielding period in which photoelectric conversion element 110 is in the light-shielding state, and outputs the signal frame image based on the read-out amount of charge.

Referring again to FIG. 22, the description of imaging device 5 is continued.

Corrector 2215 has a configuration in which some of the functions of corrector 1415 according to Modified Example 2 are changed.

Corrector 1415 according to Modified Example 2 is a configuration example in which each pixel value of the added light-shielding frame image is multiplied by the value of (Tr/(n×Ts)), to thereby generate a normalized added light-shielding frame image, and the pixel value of each pixel of the normalized added light-shielding frame image is subtracted from the corresponding pixel value of the correction target signal frame image, to thereby generate a corrected signal frame image.

On the other hand, corrector 2215 is a configuration example in which each pixel of the added light-shielding frame image is directly subtracted from the corresponding pixel of the correction target signal frame image, to thereby generate a corrected signal frame image.

Figure 24:
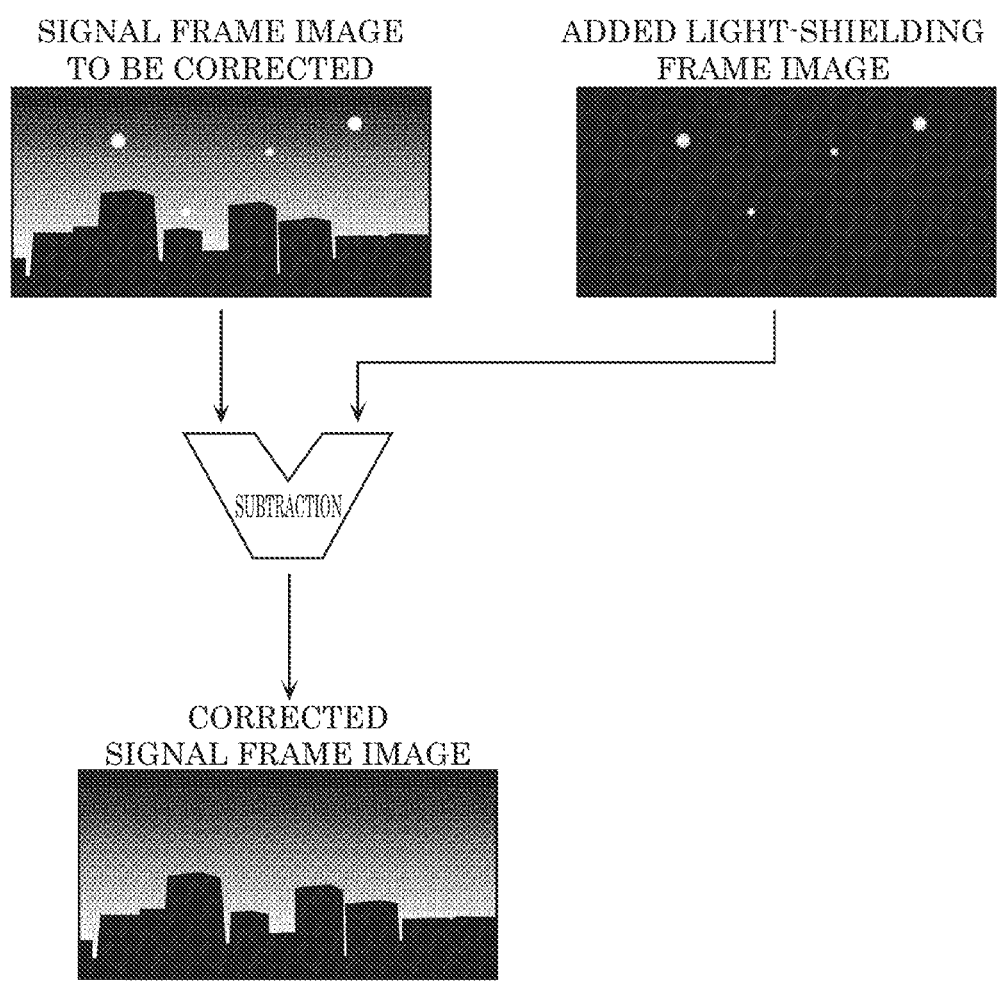
FIG. 24 is a schematic diagram illustrating a state where the corrector performs correction.

FIG. 24 is a schematic view illustrating a state where corrector 2215 performs correction.

As illustrated in the figure, corrector 2215 subtracts each pixel value of the added light-shielding frame image from the corresponding pixel value of the correction target signal frame, thereby generating a corrected signal frame image.

In imaging device 5, exposure period Tr is set to be an n-fold of light-shielding period Ts. Accordingly, corrector 2215 need not perform normalization processing on the added light-shielding frame image to normalize the sum (n×Ts) of light-shielding state periods with the exposure state period (Tr) in the correction target signal frame image, unlike corrector 1415 according to Modified Example 2.

An operation to be performed by imaging device 5 having the configuration described above will be described below with reference to the accompanying drawings.

[5-2. Operation]

Imaging device 5 performs, as characteristic operations, third frame image output processing and fifth correction processing.

These processing steps will be sequentially described below.

[5-2-1. Third Frame Image Output Processing]

The third frame image output processing is processing in which imaging element 10 alternately outputs the signal frame image and the light-shielding frame image at predetermined frame cycle T1 at a timing when the light-shielding frame image is delayed by (n/(n+1))×T1 from the signal frame image.

The third frame image output processing is processing in which a part of the first frame image output processing according to the embodiment is changed.

Figure 25:
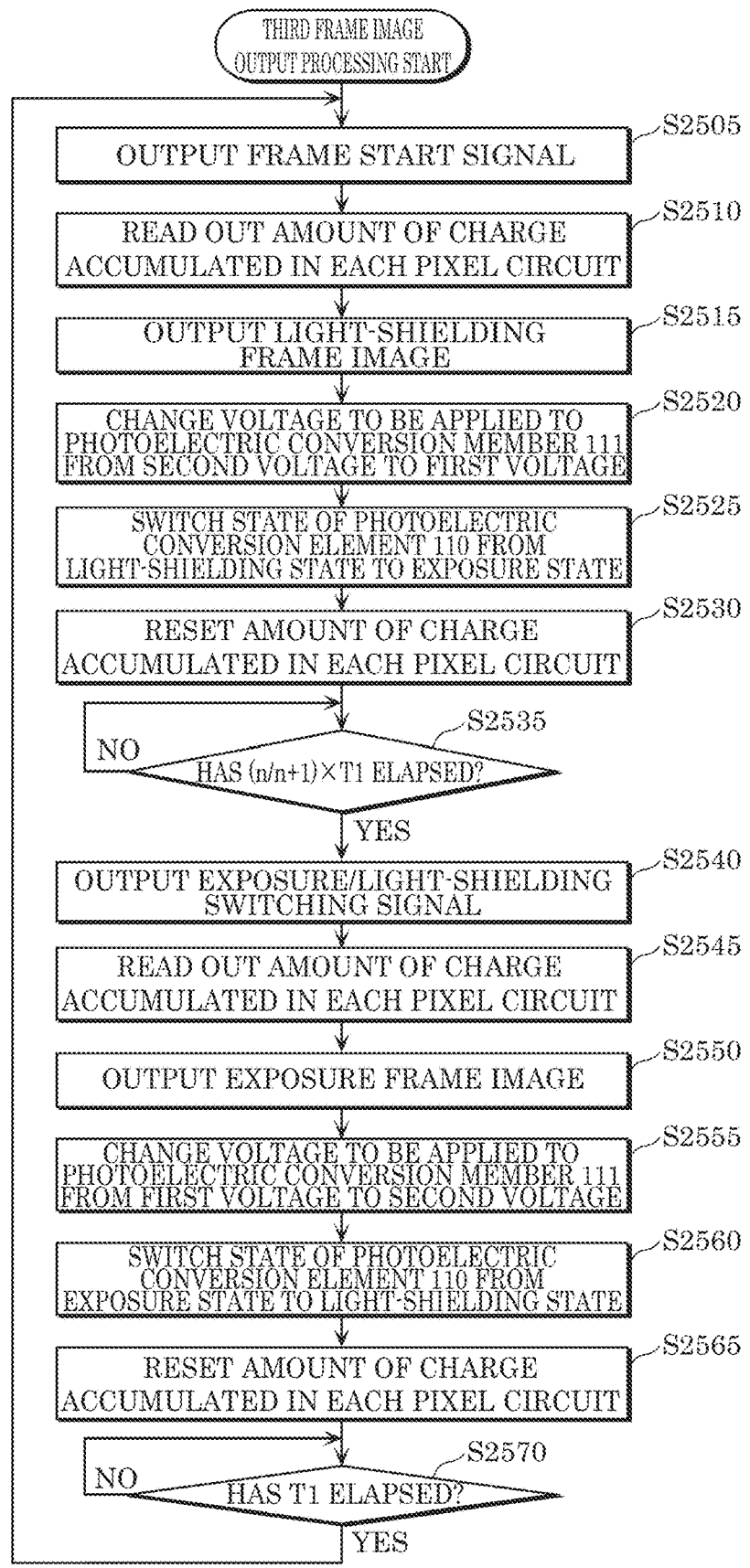
FIG. 25 is a flowchart illustrating third frame image output processing.

FIG. 25 is a flowchart illustrating the third frame image output processing.

In the figure, the processing of step S2505 to the processing of step S2530 correspond to the processing of step S5 to the processing of step S30 in the first frame image output processing according to the embodiment (see FIG. 7) in which voltage controller 20 is replaced by voltage controller 920, and the processing of step S2540 to the processing of step S2570 correspond to the processing of step S40 to the processing of step S79 in the first frame image output processing according to the embodiment (see FIG. 7) in which voltage controller 20 is replaced by voltage controller 920.

Accordingly, since the processing of step S2505 to the processing of step S2530 and the processing of step S2540 to the processing of step S2570 have been described above, only the processing of step S2535 and processing steps before and after the processing of step S2535 will now be described.

After the processing of step S2530 is finished, after a lapse of (n/(n+1))×T1 since the previous frame start signal is output (step S2535: Yes after the determination result in step S2535 repeatedly indicates No), voltage controller 2220 outputs the exposure switching signal to imaging element 10 (step S2540).

[5-2-2. Second Correction Processing]

The fifth correction processing is processing in which corrector 2215 performs correction on each pixel of the signal frame image output from imaging element 10 so as to reduce dark current signal components from the correction target signal frame image by directly subtracting the corresponding pixels of the added light-shielding frame image.

The fourth correction processing is processing in which a part of the third correction processing according to Modified Example 2 is changed.

Figure 26:
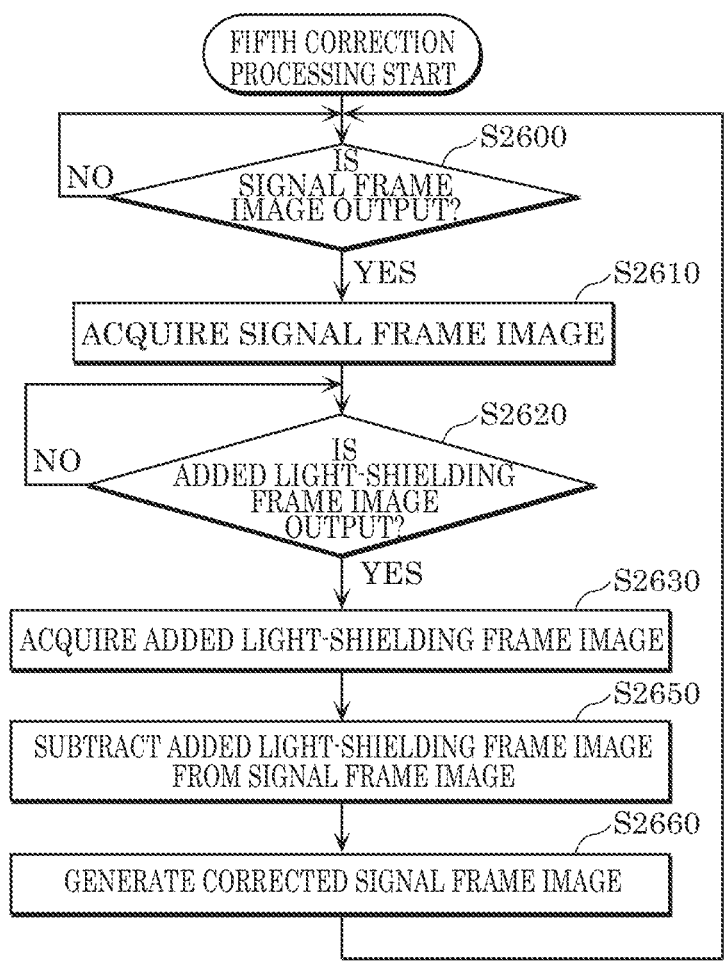
FIG. 26 is a flowchart illustrating fifth correction processing.

FIG. 26 is a flowchart illustrating the fifth correction processing.

In the figure, the processing of step S2600 to the processing of step S2630 and the processing of step S2660 correspond to the processing of step S1700 to the processing of step S1730 in the third correction processing according to Modified Example 2 (see FIG. 17) in which corrector 915 is replaced by corrector 2215.

Further, in the fifth correction processing, the processing corresponding to step S1740 in the third correction processing according to Modified Example 2 is omitted.

Accordingly, since the processing of step S2600 to the processing of step S2630 and the processing of step S2660 have been described above, only the processing of step S12650 and processing steps before and after the processing of step S2650 will now be described.

In the processing of step S2630, when an added light-shielding frame image is acquired, corrector 2215 subtracts each pixel value of the added light-shielding frame image from the corresponding pixel value of each pixel of the acquired signal frame image (step S2650), thereby generating a corrected signal frame image (step S2660).

[5-3. Effects and the Like]

As described above, in imaging device 5, corrector 2215 generates the corrected signal frame image by directly subtracting each pixel value of the added light-shielding frame image from the corresponding pixel value of the correction target signal frame image.

Accordingly, imaging device 5 according to Modified Example 4 can achieve the correction of the signal frame image with a smaller amount of calculation than in imaging device 3 according to Modified Example 2.

Supplementary Notes

The embodiment and Modified Examples 1 to 4 have been described above as examples of the technique disclosed in this application. However, the technique in the present disclosure is not limited to these examples, but also is applicable to embodiments in which modifications, substitutions, additions, omissions, and the like are made as appropriate.

(1) According to the embodiment described above, in imaging device 1, photoelectric conversion member 111 is an organic thin film having a function of generating charge due to an internal photoelectric effect when receiving light in a state where a voltage in a first predetermined range is applied, and a function of generating no charge due to the internal photoelectric effect when receiving light in a state where a voltage in a second predetermined range is applied.

However, photoelectric conversion member 111 is not necessarily limited to the organic thin film described above, as long as whether to generate charge due to the internal photoelectric effect can be controlled by an applied voltage. For example, in imaging device 1, photoelectric conversion member 111 may be a diode having a PN junction surface.

(2) According to the embodiment described above, in imaging device 1, frame cycle T1 is, for example, 1/60 seconds.

However, frame cycle T1 is not necessarily limited to 1/60 seconds.

For example, in imaging device 1, frame cycle T1 may be 1/30 seconds, or frame cycle T1 may be set by a user who uses imaging device 1.

(3) According to Modified Example 2, in imaging device 3, when a new light-shielding frame image is output from imaging element 10, added image generator 1417 adds the pixel values of corresponding pixels in the n latest light-shielding frame images in a chronological order that include the newly output light-shielding frame image and are output from imaging element 10, thereby generating the added light-shielding frame image.

However, the method of generating the added light-shielding frame image is not necessarily limited to the above-described method.

In one example, when a new light-shielding frame image is output after the added light-shielding frame image is already generated, the new light-shielding frame image is incorporated into the already generated added light-shielding frame image by calculation processing such as averaging or IIR (Infinite Impulse Response), thereby updating the added light-shielding frame image.

In another example, weighting addition is performed on the pixel values of the corresponding pixels in the n light-shielding frame images so that a larger weight is applied to a newer light-shielding frame image in the chronological order, thereby generating the added light-shielding frame image. With this configuration, more recently output light-shielding frame images can be reflected in the reduction of dark current signal components.

(4) The present disclosure includes an electronic device incorporating imaging device 1 according to the embodiment, as a matter of course.

Figure 27A:
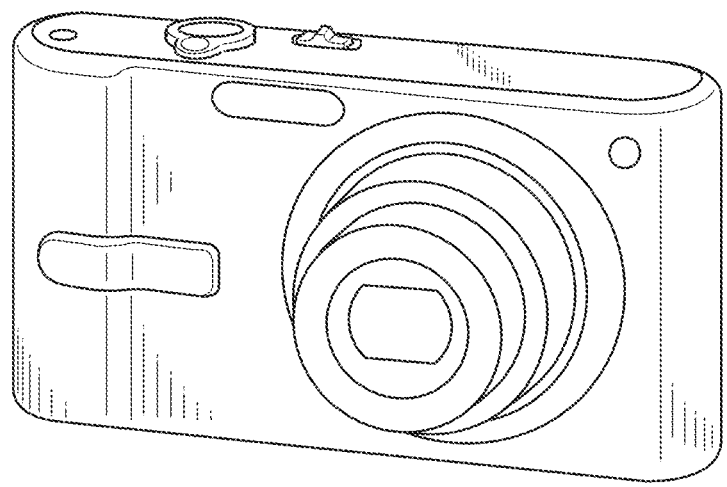
FIG. 27A is a perspective view illustrating a digital still camera according to a modified example.
Figure 27B:
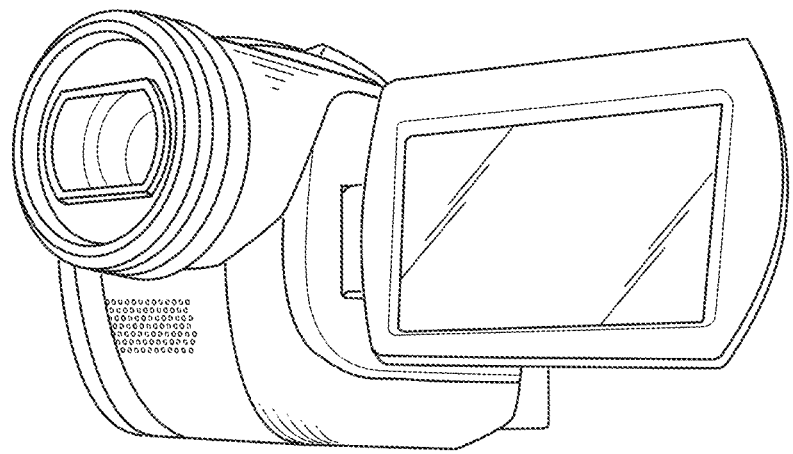
FIG. 27B is a perspective view illustrating a video camera according to a modified example.

Such an electronic device is implemented as, for example, a digital still camera illustrated in FIG. 27A, or a video camera illustrated in FIG. 27B.

(5) According to the embodiment described above, as illustrated in FIG. 1, imaging device 1 is provided separately from optical system 210. However, imaging device 1 is not necessarily limited to the configuration in which imaging device 1 is provided separately from optical system 210. For example, imaging device 1 may be a lens-equipped camera including optical system 210 and lens driver 220.

(6) It should be noted that the constituent elements (functional blocks) included in imaging devices 1 to 5 are implemented into a Large Scale Integration (LSI) which is an integrated circuit. These may be integrated separately, or a part or all of them may be integrated into a single chip. The technique of integrated circuit is not limited to the LSI, and it may be implemented as a dedicated circuit or a general-purpose processor. It is also possible to use a Field Programmable Gate Array (FPGA) that can be programmed after manufacturing the LSI, or a reconfigurable processor in which connection and setting of circuit cells inside the LSI can be reconfigured. Furthermore, if due to the progress of semiconductor technologies or their derivations, new technologies for integrated circuits appear to be replaced with the LSIs, it is, of course, possible to use such technologies to implement the functional blocks as an integrated circuit. For example, biotechnology and the like can be applied to the above implementation.

It should also be noted that a part or all of the above-described steps of the processing may be implemented by hardware such as an electronic circuit or by software. The processing by software is implemented when a processor included in imaging device 1 executes a program recorded on a memory. The program may be recorded onto a recording medium and distributed. For example, it is possible that such a distributed program is installed in a device having another processor and executed by the other processor so as to allow the other processor to perform the above-described steps of the processing.

It should also be noted that other embodiments with any combinations of the constituent elements and functions described in the above-described embodiment and modified examples are also embodiments of the present disclosure.

(7) Imaging device 1 according to an aspect of the present disclosure includes: imaging element 10 including: photoelectric conversion member 111 that generates charge due to an internal photoelectric effect when receiving light in a state where a voltage in a first predetermined range is applied, and generates no charge due to the internal photoelectric effect when receiving light in a state where a voltage in a second predetermined range is applied; and pixel circuits 21 that accumulate, in each pixel, the charge generated by photoelectric conversion member 111, imaging element 10 outputting a frame image based on an amount of charge accumulated in pixel circuits 21; voltage controller 20 that controls a voltage to be applied to photoelectric conversion member 111; and corrector 15 that performs correction on at least a part of one or more frame images output from imaging element 10 to reduce dark current signal components, wherein voltage controller 20 performs the control in such a manner that, during an exposure period included in a predetermined frame cycle, the voltage in the first predetermined range is applied to photoelectric conversion member 111, and during a light-shielding period other than the exposure period in the frame cycle, the voltage in the second predetermined range is applied to photoelectric conversion member 111, imaging element 10 outputs, every frame cycle, a signal frame image based on an amount of charge accumulated in pixel circuits 21 during the exposure period, and a light-shielding frame image based on an amount of charge accumulated in pixel circuits 21 during the light-shielding period, and corrector 15 performs the correction on the signal frame image output from imaging element 10 by using the light-shielding frame image output from imaging element 10.

In imaging device 1, dark current components in the light-shielding state are accumulated as charge in each pixel circuit 21 in the light-shielding period. Further, imaging element 10 outputs the light-shielding frame image based on the amount of charge accumulated in each pixel circuit 21 in the light-shielding period during the image capturing period of capturing successive signal frame images. On the other hand, corrector 15 performs correction based on the light-shielding frame so as to reduce dark current signal components from the signal frame image.

Accordingly, imaging device 1 can perform the correction based on the dark current signal components in the light-shielding state that are acquired during the image capturing period of capturing successive frame images so as to reduce the dark current signal components included in frame images captured during the image capturing period.

In general, dark current signal components vary depending on the temperature of imaging element 10 or the like. Accordingly, if the temperature of imaging element 10 or the like varies during the image capturing period of capturing successive frame images, the dark current signal components also vary. Accordingly, imaging device 1 can reduce the dark current signal components, which are included in frame images captured during the image capturing period of capturing successive signal frame images, more accurately than in the imaging device of the related art that cannot acquire dark current signal components during the image capturing period.

For example, it is also possible that imaging element 10 is an organic complementary metal-oxide-semiconductor (CMOS) image sensor that includes an organic thin film as photoelectric conversion member 111.

With this configuration, high integration of imaging element 10 can be achieved.

For example, it is further possible that a length of the exposure period is equal to a length of the light-shielding period, and that corrector 15 performs the correction by subtracting, from a pixel value of each pixel forming the signal frame image to be corrected, a pixel value of a corresponding pixel forming the light-shielding frame image output from imaging element 10 in a same frame cycle as the signal frame image.

With this configuration, the correction by corrector 15 can be achieved by calculation with a relatively small amount of processing.

For example, it is further possible that corrector 15 performs the correction by subtracting, from a pixel value of each pixel forming the signal frame image to be corrected, a value obtained by multiplying a pixel value of a corresponding pixel forming the light-shielding frame image output from imaging element 10 in a same frame cycle as the signal frame image by a ratio of the exposure period to the light-shielding period.

With this configuration, corrector 15 can perform the correction even when a length of the exposure period and a length of the light-shielding period are not equal.

For example, it is further possible that a length of the exposure period is equal to a length of the light-shielding period, that imaging device 1 further comprises averaged image generator 1817 that generates an averaged light-shielding frame image by averaging pixel values of corresponding pixels in a plurality of light-shielding frame images, and that corrector 15 performs the correction by subtracting, from a pixel value of each pixel forming the signal frame image to be corrected, a pixel value of a corresponding pixel forming the averaged light-shielding frame image generated by averaged image generator 1817.

With this configuration, random components included in dark current signal components can be reduced.

For example, it is further possible that imaging device 1 further includes: added image generator 1417 that generates an added light-shielding frame image by adding pixel values of corresponding pixels in a plurality of light-shielding frame images, wherein corrector 15 performs the correction based on the added light-shielding frame image generated by added image generator 1417.

With this configuration, random components included in dark current signal components can be reduced.

For example, it is further possible that a ratio of the exposure period to the light-shielding period is n: 1, where n is an integer equal to or greater than 2, added image generator 1417 generates the added image using n light-shielding frame images output from imaging element 10, and that corrector 15 performs the correction by subtracting, from a pixel value of each pixel forming the signal frame image to be corrected, a pixel value of a corresponding pixel forming the added image generated by added image generator 1417.

With this configuration, the correction by corrector 15 using dark current signal components from which random components are reduced can be achieved by calculation with a relatively small amount of processing.

For example, it is further possible that added image generator 1417 generates the added image to sequentially generate added images using n successive light-shielding frame images in a chronological order, and corrector 15 performs the correction by subtracting, from a pixel value of each pixel forming the signal frame image to be corrected, a pixel value of a corresponding pixel forming the added image generated by added image generator 1417 using n successive light-shielding frame images including the light-shielding frame image output from imaging element 10 in a same frame cycle as the signal frame image.

With this configuration, the correction using dark current signal components from which random components are reduced can be achieved using a light-shielding frame image group with a minimum imaging time difference.

Camera 200 according to another aspect of the present disclosure includes: imaging device 1; and a lens that focuses external light on imaging element 10.

In camera 200, dark current components in the light-shielding state are accumulated as charge in each pixel circuit 21 in the light-shielding period. Further, imaging element 10 outputs the light-shielding frame image based on the amount of charge accumulated in each pixel circuit 21 in the light-shielding period during the image capturing period of capturing successive signal frame images. On the other hand, corrector 15 performs the correction based on the light-shielding frame so as to reduce dark current signal components from the signal frame image.

Accordingly, camera 200 can perform the correction based on dark current signal components in the light-shielding state that are acquired during the image capturing period of capturing successive frame images so as to reduce dark current signal components included in frame images captured in the image capturing period.

An imaging method according to still another aspect of the present disclosure is to be performed by imaging device 1 including imaging element 10, voltage controller 20, and corrector 15. Imaging element 10 includes: photoelectric conversion member 111 that generates charge due to an internal photoelectric effect when receiving light in a state where a voltage in a first predetermined range is applied, and generates no charge due to the internal photoelectric effect when receiving light in a state where a voltage in a second predetermined range is applied; and pixel circuits 21 that accumulate, in each pixel, the charge generated by photoelectric conversion member 111. The imaging method includes: outputting, by imaging element 10, a frame image based on an amount of charge accumulated in pixel circuits 21; controlling, by voltage controller 20, a voltage to be applied to photoelectric conversion member 111; and performing, by corrector 15, correction on at least a part of one or more frame images output from imaging element 10 to reduce dark current signal components, wherein in the controlling, the controlling is performed by voltage controller 20 in such a manner that, during an exposure period included in a predetermined frame cycle, the voltage in the first predetermined range is applied to photoelectric conversion member 111, and during a light-shielding period other than the exposure period in the frame cycle, the voltage in the second predetermined range is applied to photoelectric conversion member 111, in the outputting of the frame image, imaging element 10 outputs, every frame cycle, a signal frame image based on an amount of charge accumulated in pixel circuits 21 during the exposure period, and a light-shielding frame image based on an amount of charge accumulated in pixel circuits 21 during the light-shielding period, and in the performing of the correction, the correction is performed by corrector 15 on the signal frame image output from imaging element 10 by using the light-shielding frame image output from imaging element 10.

According to the imaging method, the dark current components in the light-shielding state are accumulated as charge in each pixel circuit 21 in the light-shielding period. Further, imaging element 10 outputs the light-shielding frame image based on the amount of charge accumulated in each pixel circuit 21 in the light-shielding period during the image capturing period of capturing successive signal frame images. On the other hand, corrector 15 performs the correction based on the light-shielding frame so as to reduce dark current signal components from the signal frame image.

Therefore, according to the imaging method, it is possible to perform the correction based on dark current signal components in the light-shielding state that are acquired during the image capturing period of capturing successive frame images so as to reduce dark current signal components included in frame images captured during the image capturing period.

Although only some exemplary embodiment and modified examples of the present disclosure have been described in detail above, those skilled in the art will readily appreciate that many modifications are possible in the exemplary embodiment and modified examples without materially departing from the novel teachings and advantages of the present disclosure. Accordingly, all such modifications are intended to be included within the scope of the present disclosure.

INDUSTRIAL APPLICABILITY

The present disclosure is widely applicable to imaging devices that capture images.

What is claimed is:

1. An imaging device, comprising:
an imaging element including:
a photoelectric conversion member that generates charge due to an internal photoelectric effect when receiving light in a state where a voltage in a first predetermined range is applied, and generates no charge due to the internal photoelectric effect when receiving light in a state where a voltage in a second predetermined range is applied; and
a plurality of pixel circuits that accumulate, in each pixel, the charge generated by the photoelectric conversion member,
the imaging element outputting a frame image based on an amount of charge accumulated in the plurality of pixel circuits;
a voltage controller that controls a voltage to be applied to the photoelectric conversion member; and
a corrector that performs correction on at least a part of one or more frame images output from the imaging element to reduce dark current signal components, wherein
the voltage controller performs the control in such a manner that, during an exposure period included in a predetermined frame cycle, the voltage in the first predetermined range is applied to the photoelectric conversion member, and during a light-shielding period other than the exposure period in the predetermined frame cycle, the voltage in the second predetermined range is applied to the photoelectric conversion member,
the imaging element outputs, every frame cycle, a signal frame image based on an amount of charge accumulated in the plurality of pixel circuits during the exposure period, and a light-shielding frame image based on an amount of charge accumulated in the plurality of pixel circuits during the light-shielding period, and
the corrector performs the correction on the signal frame image output from the imaging element by using the light-shielding frame image output from the imaging element.

2. The imaging device according to claim 1, wherein the imaging element is an organic complementary metal-oxide-semiconductor (CMOS) image sensor that includes an organic thin film as the photoelectric conversion member.

3. The imaging device according to claim 1, wherein
a length of the exposure period is equal to a length of the light-shielding period, and
the corrector performs the correction by subtracting, from a pixel value of each pixel forming the signal frame image to be corrected, a pixel value of a corresponding pixel forming the light-shielding frame image output from the imaging element in a same frame cycle as the signal frame image.

4. The imaging device according to claim 1, wherein
the corrector performs the correction by subtracting, from a pixel value of each pixel forming the signal frame image to be corrected, a value obtained by multiplying a pixel value of a corresponding pixel forming the light-shielding frame image output from the imaging element in a same frame cycle as the signal frame image by a ratio of the exposure period to the light-shielding period.

5. The imaging device according to claim 1, wherein
a length of the exposure period is equal to a length of the light-shielding period,
the imaging device further comprises an averaged image generator that generates an averaged light-shielding frame image by averaging pixel values of corresponding pixels in a plurality of light-shielding frame images, and
the corrector performs the correction by subtracting, from a pixel value of each pixel forming the signal frame image to be corrected, a pixel value of a corresponding pixel forming the averaged light-shielding frame image generated by the averaged image generator.

6. The imaging device according to claim 1, further comprising:
an added image generator that generates an added light-shielding frame image by adding pixel values of corresponding pixels in a plurality of light-shielding frame images,
wherein the corrector performs the correction based on the added light-shielding frame image generated by the added image generator.

7. The imaging device according to claim 6, wherein
a ratio of the exposure period to the light-shielding period is n: 1, where n is an integer equal to or greater than 2,
the added image generator generates the added image using n light-shielding frame images output from the imaging element, and
the corrector performs the correction by subtracting, from a pixel value of each pixel forming the signal frame image to be corrected, a pixel value of a corresponding pixel forming the added image generated by the added image generator.

8. The imaging device according to claim 6, wherein
the added image generator generates the added image to sequentially generate added images using n successive light-shielding frame images in a chronological order, and
the corrector performs the correction by subtracting, from a pixel value of each pixel forming the signal frame image to be corrected, a pixel value of a corresponding pixel forming the added image generated by the added image generator using n successive light-shielding frame images including the light-shielding frame image output from the imaging element in a same frame cycle as the signal frame image.

9. A camera, comprising:
an imaging device according to claim 1; and
a lens that focuses external light on the imaging element.

10. An imaging method to be performed by an imaging device including an imaging element, a voltage controller, and a corrector, the imaging element including: a photoelectric conversion member that generates charge due to an internal photoelectric effect when receiving light in a state where a voltage in a first predetermined range is applied, and generates no charge due to the internal photoelectric effect when receiving light in a state where a voltage in a second predetermined range is applied; and a plurality of pixel circuits that accumulate, in each pixel, the charge generated by the photoelectric conversion member,
the imaging method, comprising:
outputting, by the imaging element, a frame image based on an amount of charge accumulated in the plurality of pixel circuits;
controlling, by the voltage controller, a voltage to be applied to the photoelectric conversion member; and
performing, by the corrector, correction on at least a part of one or more frame images output from the imaging element to reduce dark current signal components, wherein in the controlling, the controlling is performed by the voltage controller in such a manner that, during an exposure period included in a predetermined frame cycle, the voltage in the first predetermined range is applied to the photoelectric conversion member, and during a light-shielding period other than the exposure period in the predetermined frame cycle, the voltage in the second predetermined range is applied to the photoelectric conversion member, in the outputting of the frame image, the imaging element outputs, every frame cycle, a signal frame image based on an amount of charge accumulated in the plurality of pixel circuits during the exposure period, and a light-shielding frame image based on an amount of charge accumulated in the plurality of pixel circuits during the light-shielding period, and in the performing of the correction, the correction is performed by the corrector on the signal frame image output from the imaging element by using the light-shielding frame image output from the imaging element.

* * * * *